(12) United States Patent
Song et al.

(10) Patent No.: US 10,665,514 B2
(45) Date of Patent: May 26, 2020

(54) CONTROLLING ACTIVE FIN HEIGHT OF FINFET DEVICE USING ETCH PROTECTION LAYER TO PREVENT RECESS OF ISOLATION LAYER DURING GATE OXIDE REMOVAL

(71) Applicant: International Business Machines Corporation, Armonk, NY (US)

(72) Inventors: Yi Song, Albany, NY (US); Veeraraghavan S. Baskar, Schenectady, NY (US); Jay W. Strane, Warwick, NY (US); Ekmini Anuja De Silva, Slingerlands, NY (US)

(73) Assignee: International Business Machines Corporation, Armonk, NY (US)

(*) Notice: Subject to any disclaimer, the term of this patent is extended or adjusted under 35 U.S.C. 154(b) by 2 days.

(21) Appl. No.: 16/011,864

(22) Filed: Jun. 19, 2018

(65) Prior Publication Data

US 2019/0385916 A1 Dec. 19, 2019

(51) Int. Cl.
| | |
|---|---|
| H01L 21/8238 | (2006.01) |
| H01L 21/311 | (2006.01) |
| H01L 27/092 | (2006.01) |
| H01L 21/3105 | (2006.01) |
| H01L 29/66 | (2006.01) |

(52) U.S. Cl.
CPC ........ H01L 21/823878 (2013.01); H01L 21/31056 (2013.01); H01L 21/31116 (2013.01); H01L 21/31144 (2013.01); H01L 21/823821 (2013.01); H01L 27/0924 (2013.01); H01L 29/66545 (2013.01)

(58) Field of Classification Search
CPC ....... H01L 21/823878; H01L 21/31056; H01L 21/823821; H01L 29/66545; H01L 27/0924; H01L 21/31144; H01L 21/31116
See application file for complete search history.

(56) References Cited

U.S. PATENT DOCUMENTS

| | | |
|---|---|---|
| 6,764,922 B2 | 7/2004 | Beyer et al. |
| 6,926,926 B2 | 8/2005 | Cho et al. |
| 8,354,320 B1 | 1/2013 | Xie et al. |
| 8,697,522 B2 | 4/2014 | Cheng et al. |
| 8,815,742 B2 | 8/2014 | Cai et al. |

(Continued)

FOREIGN PATENT DOCUMENTS

CN 103187280 A 7/2013

OTHER PUBLICATIONS

Xing Wei, et al., "Bulk FinFETs with body spacers for improving fin height variation," Solid-State Electronics, 2016, pp. 45-51, 122.

*Primary Examiner* — Thanh Y. Tran
(74) *Attorney, Agent, or Firm* — Vazken Alexanian; Ryan, Mason & Lewis, LLP

(57) ABSTRACT

Semiconductor devices and methods are provided to fabricate fin field-effect transistor (FinFET) devices having uniform fin height profiles. For example, uniformity of fin height profiles for FinFET devices is obtained by implementing a gate oxide removal process which is designed to prevent etching of an isolation layer (e.g., a shallow trench isolation layer) formed of an oxide material during removal of, e.g., sacrificial gate oxide layers of dummy gate structures during a replacement metal gate process.

16 Claims, 20 Drawing Sheets

(56) References Cited

U.S. PATENT DOCUMENTS

| | | |
|---|---|---|
| 9,209,033 B2 | 12/2015 | Fernandez et al. |
| 9,236,308 B1 | 1/2016 | Sung et al. |
| 9,548,303 B2 | 1/2017 | Lee et al. |
| 9,865,598 B1 | 1/2018 | Bi et al. |
| 2013/0200470 A1* | 8/2013 | Liu .................. H01L 29/66795 257/408 |
| 2014/0203376 A1 | 7/2014 | Xie et al. |
| 2014/0210010 A1 | 7/2014 | Liu et al. |
| 2014/0306317 A1 | 10/2014 | Licausi |
| 2014/0353795 A1 | 12/2014 | Tong et al. |
| 2015/0270341 A1 | 9/2015 | Yin et al. |

\* cited by examiner

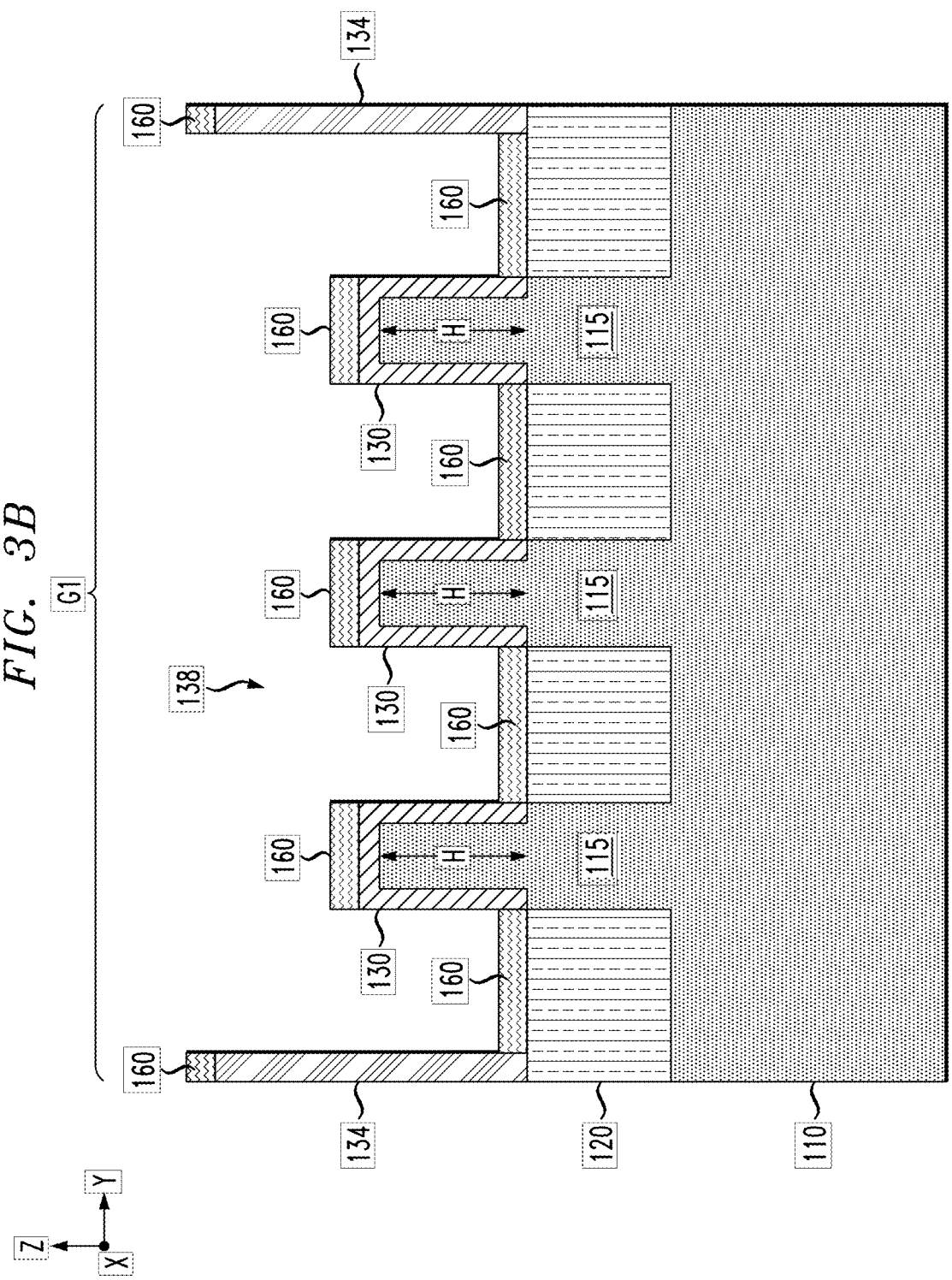

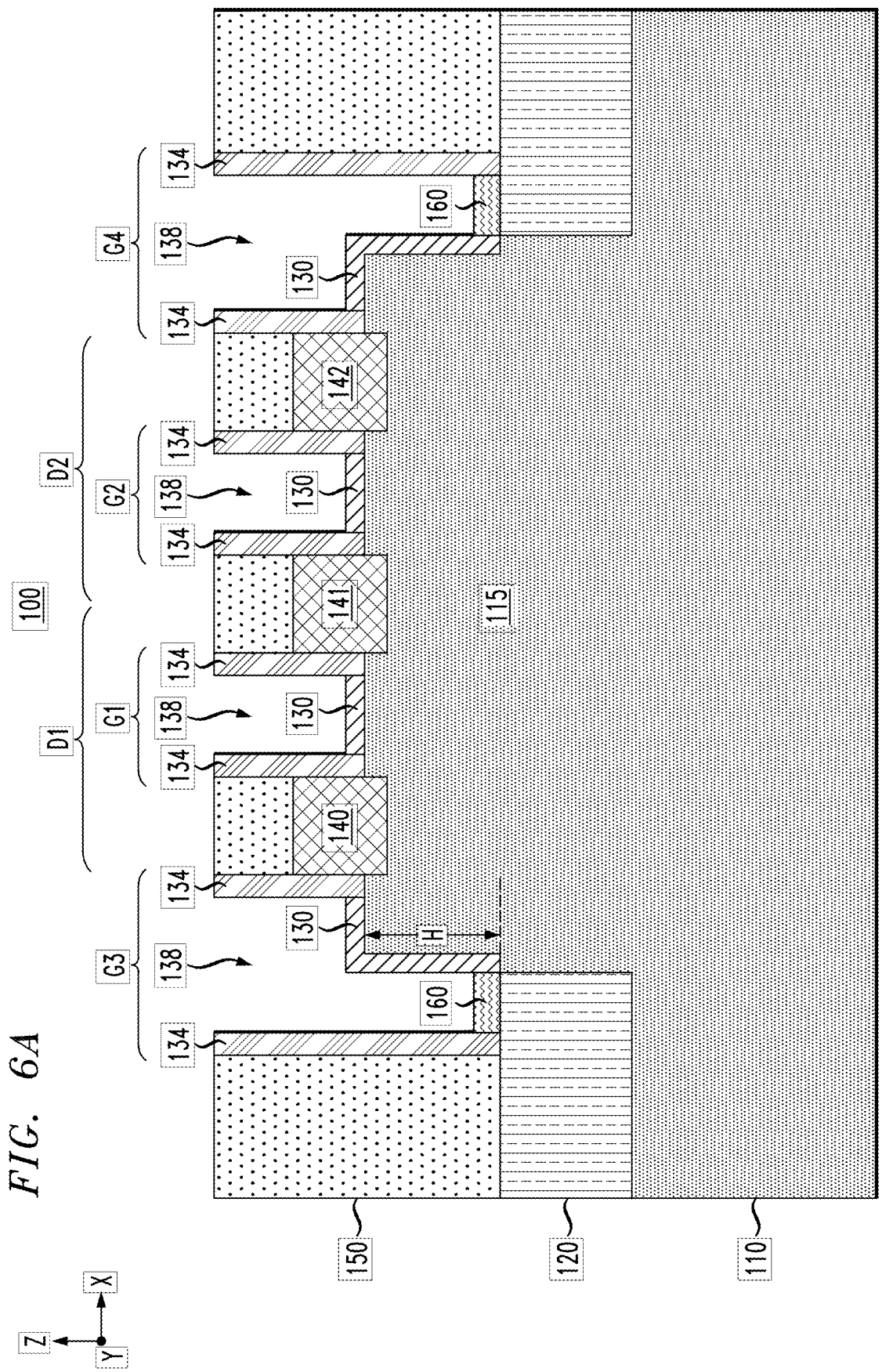

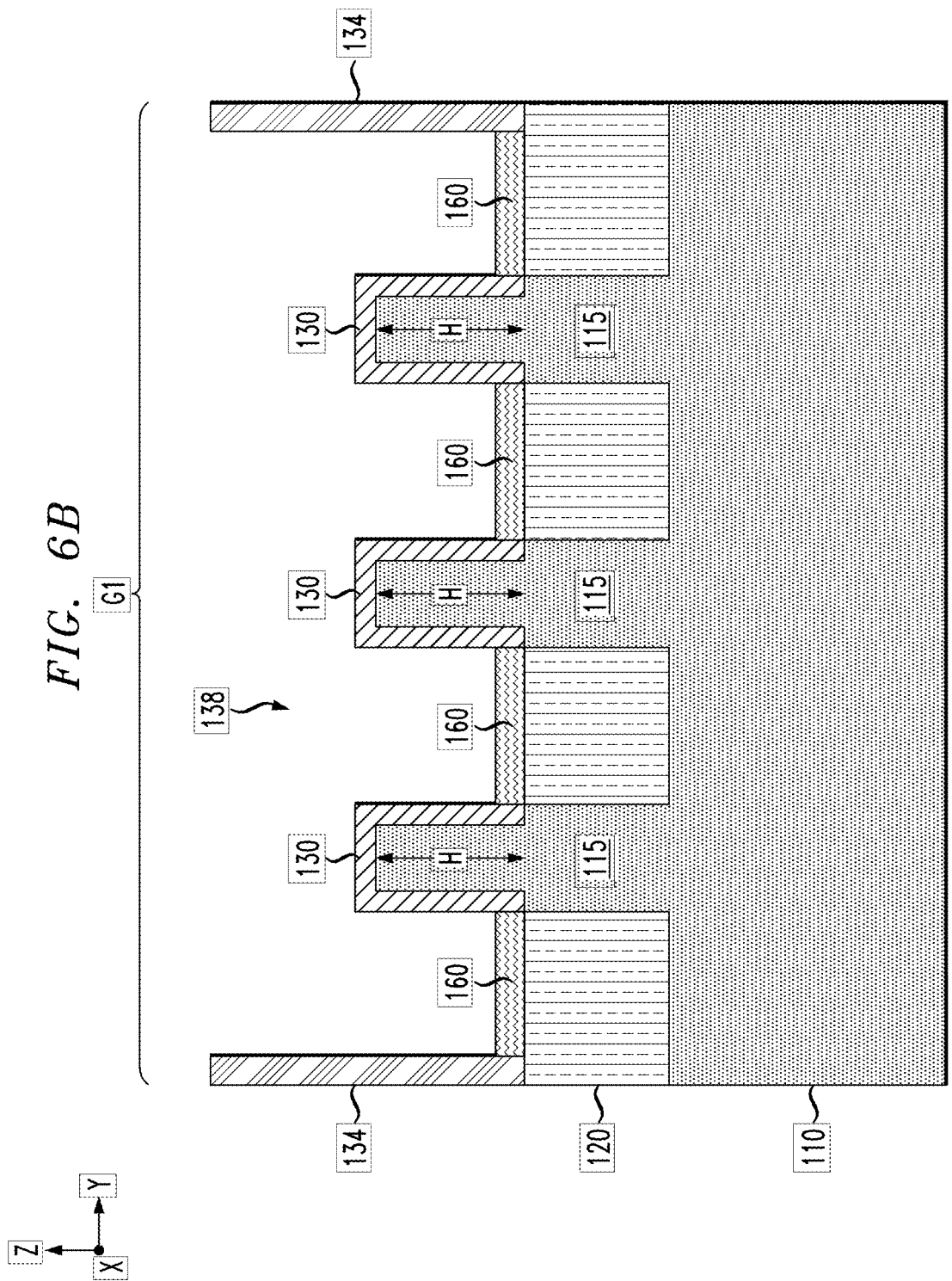

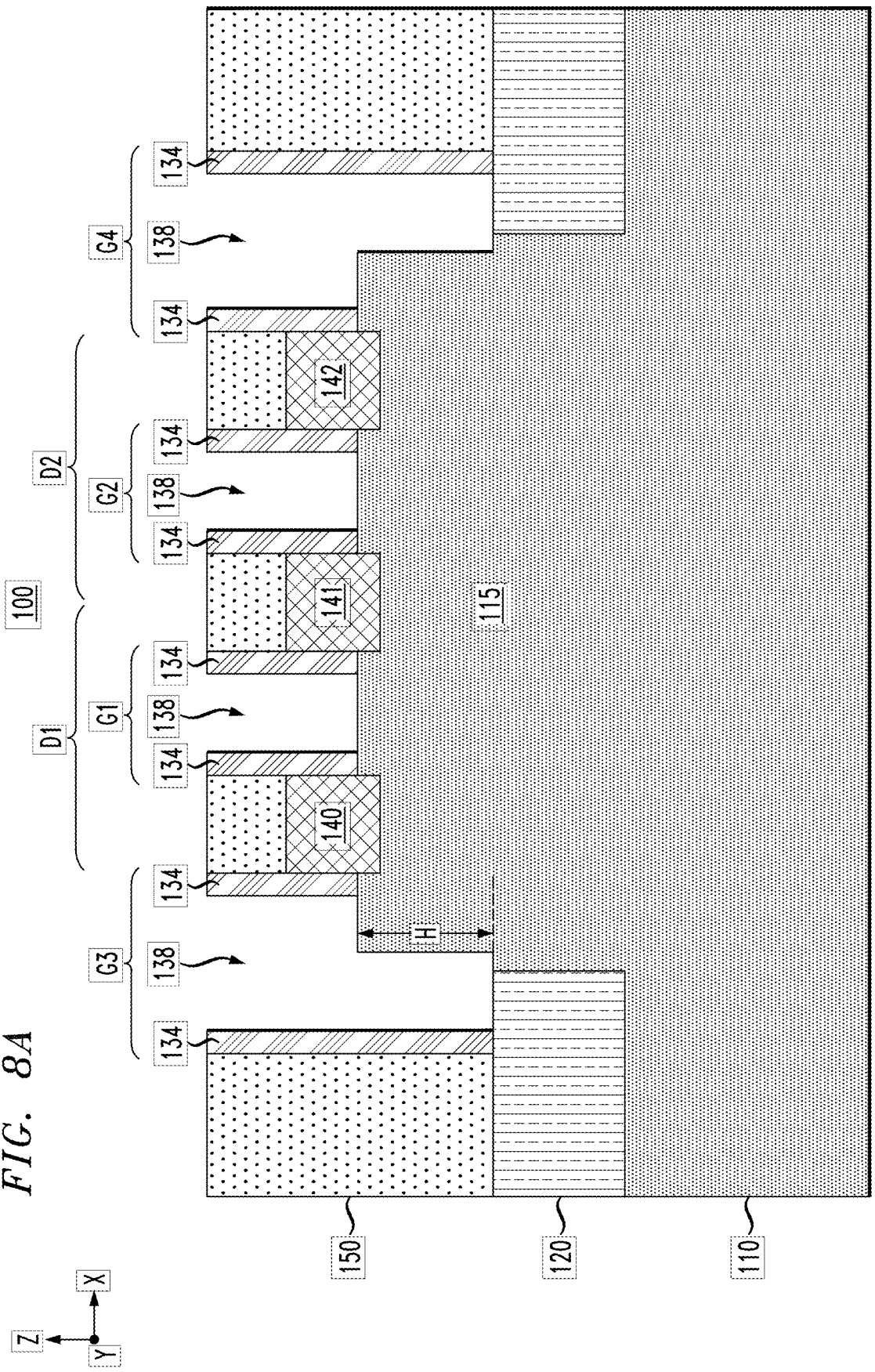

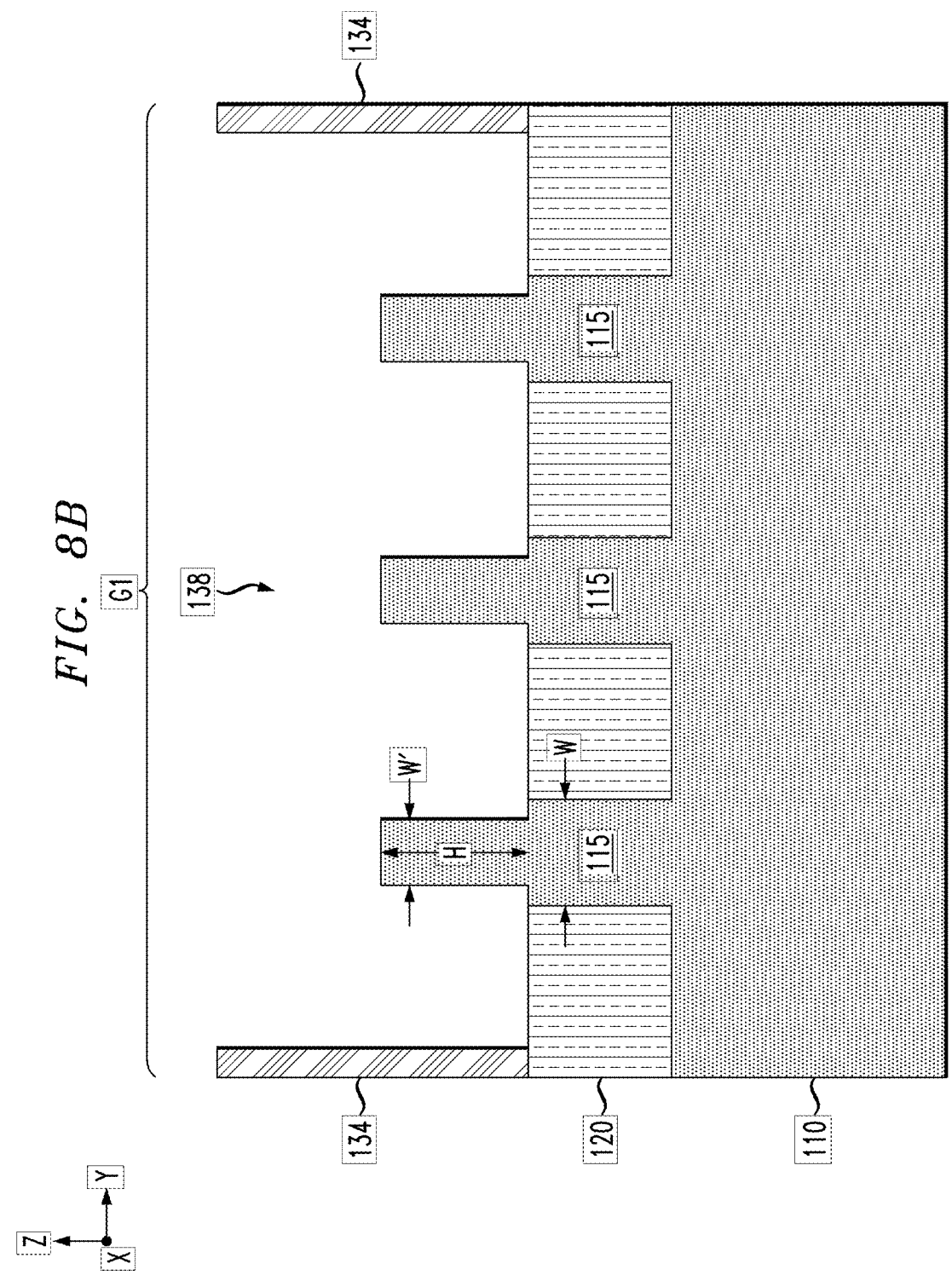

CONTROLLING ACTIVE FIN HEIGHT OF FINFET DEVICE USING ETCH PROTECTION LAYER TO PREVENT RECESS OF ISOLATION LAYER DURING GATE OXIDE REMOVAL

TECHNICAL FIELD

This disclosure generally relates to semiconductor fabrication techniques and, in particular, techniques for fabricating fin field-effect transistor (FinFET) devices.

BACKGROUND

As semiconductor manufacturing technologies continue to evolve toward smaller design rules and higher integration densities (e.g., 14 nm technology node and beyond), integrated circuit devices and components become increasingly smaller, creating challenges in layout formation and device optimization. Currently, FinFET technologies are typically implemented for FET fabrication, as such technologies provide effective CMOS scaling solutions for FET fabrication at, and below, the 14 nm technology node. A FinFET device comprises a three-dimensional fin-shaped FET structure which includes at least one vertical semiconductor fin formed on a substrate, a gate structure formed over a portion of the vertical semiconductor fin, and source/drain layers formed from portions of the vertical semiconductor fin extending from both sides of the gate structure. The portion of the vertical semiconductor fin that is covered by the gate structure between the source/drain layers comprises a channel region of the FinFET device.

The ability to fabricate vertical semiconductor fins having uniform profiles has proven to be challenging and non-trivial using current FinFET process technologies. For example, in a typical bulk FinFET process flow in which semiconductor fins are formed on a surface of a semiconductor substrate, a shallow trench isolation (STI) layer is formed to cover bottom portions of vertical semiconductor fins to provide an isolation layer which isolates the FinFET device elements (e.g., gates, source/drain layers, etc.) from the bulk substrate. However, during a gate oxide etch process (e.g., removing a dummy gate oxide), the exposed portions of the STI layer will be etched and recessed, resulting in non-uniform heights of the vertical semiconductor fins across the device regions of the wafer or chip. This undesired recessing of the STI layer during the oxide etch is even more problematic when semiconductor fin profile thinning techniques are applied to decrease the width of the active portions of the vertical semiconductor fins which extend above the STI layer. In this instance, the active fin profile of the FinFET devices will include the thinned portions of the vertical semiconductor fins, as well as a portion of the non-thinned portion of the vertical semiconductor fins due to the additional recess of the STI layer. This results in FinFET devices with non-uniform fin profiles as well as gate structures with a large effective oxide thickness (EOT) which creates undesired leakage paths. This situation is even more problematic when over-etch is needed to remove thick thermal oxide layers and the etch rate selectivity between the thermal oxide material and the STI oxide material is poor, such that significant STI oxide loss will occur.

SUMMARY

Embodiments of the invention include methods for fabricating FinFET devices having uniform fin height profiles. For example, one embodiment includes a method for fabricating a semiconductor device, wherein the method comprises: forming a vertical semiconductor fin on a semiconductor substrate; forming an isolation layer on the semiconductor substrate, wherein the isolation layer covers a bottom portion of the vertical semiconductor fin, and wherein an active portion of the vertical semiconductor fin extends above a surface of the isolation layer; forming a dummy gate structure to overlap a portion of the active portion of the vertical semiconductor fin, wherein the dummy gate structure comprises a sacrificial gate oxide layer, a sacrificial gate electrode layer formed on the sacrificial gate oxide layer, and a gate sidewall spacer surrounding sidewalls of the sacrificial gate electrode layer; removing the dummy gate structure by etching the sacrificial gate electrode layer, etching the sacrificial gate oxide layer, and utilizing a first etch protection layer to prevent recessing of the isolation layer during the etching of the sacrificial gate oxide layer; and forming a metallic gate structure in place of the dummy gate structure.

Another embodiment includes a method for fabricating a semiconductor device, wherein the method comprises: forming a vertical semiconductor fin on a semiconductor substrate, the vertical semiconductor fin having a first width; forming an isolation layer on the semiconductor substrate, wherein the isolation layer covers a bottom portion of the vertical semiconductor fin, and wherein an active portion of the vertical semiconductor fin extends above a surface of the isolation layer; selectively oxidizing a surface of the active portion of the vertical semiconductor fin which extends above a surface of the isolation layer to form a sacrificial gate oxide layer; forming a dummy gate structure to overlap a portion of the active portion of the vertical semiconductor fin, wherein the dummy gate structure comprises the sacrificial gate oxide layer, a sacrificial gate electrode layer formed on the sacrificial gate oxide layer, and a gate sidewall spacer surrounding sidewalls of the sacrificial gate electrode layer; removing the dummy gate structure by etching the sacrificial gate electrode layer, etching the sacrificial gate oxide layer, and utilizing a first etch protection layer to prevent recessing of the isolation layer during the etching of the sacrificial gate oxide layer; and forming a metallic gate structure in place of the dummy gate structure.

Another embodiment includes a semiconductor device. The semiconductor device comprises: a vertical semiconductor fin formed on a semiconductor substrate, the vertical semiconductor fin comprising a first fin portion having a first width, and a second fin portion having a second width, wherein the second width is less than the first width; an isolation layer formed on the semiconductor substrate, wherein the isolation layer covers the first fin portion, and wherein the second fin portion extends above a surface of the isolation layer; and a FinFET device formed on the semiconductor substrate, wherein the FinFET device comprises the second fin portion of the vertical semiconductor fin, a gate structure which overlaps a portion of the second fin portion of the vertical semiconductor fin, and source/drain layers formed on exposed portions of the second fin portion of the vertical semiconductor fin which extend from the gate structure on opposing sides of the gate structure. The isolation layer prevents the gate structure from being formed in contact with sidewalls of the first fin portion of the vertical semiconductor fin.

Other embodiments will be described in the following detailed description of embodiments, which is to be read in conjunction with the accompanying figures.

BRIEF DESCRIPTION OF THE DRAWINGS

FIG. 1D is a schematic top plan view of the semiconductor device shown in FIGS. 1A, 1B and 1C, wherein FIG. 1A is a cross-sectional side view of the semiconductor device along line 1A-1A in FIG. 1D, wherein FIG. 1B is a cross-sectional side view of the semiconductor device along line 1B-1B in FIG. 1D, and wherein FIG. 1C is a cross-sectional side view of the semiconductor device along line 1C-1C in FIG. 1D.

FIG. 3B is a cross-sectional side view of the semiconductor device of FIG. 2B after selectively forming the first etch protection layer on the exposed lateral surfaces of the semiconductor device including the exposed surfaces of isolation layer within the gate openings.

FIG. 6A is a cross-sectional side view of the semiconductor device of FIG. 5A after performing an etch process to selectively remove the second etch protection layer.

FIG. 6B is a cross-sectional side view of the semiconductor device of FIG. 5B after performing the etch process to selectively remove the second etch protection layer.

FIG. 8A is a cross-sectional side view of the semiconductor device of FIG. 7A after performing an etch process to selectively remove remaining portions of the first etch protection layer.

FIG. 8B is a cross-sectional side view of the semiconductor device of FIG. 7B after performing the etch process to selectively remove remaining portions of the first etch protection layer.

DETAILED DESCRIPTION

Figure 1A:
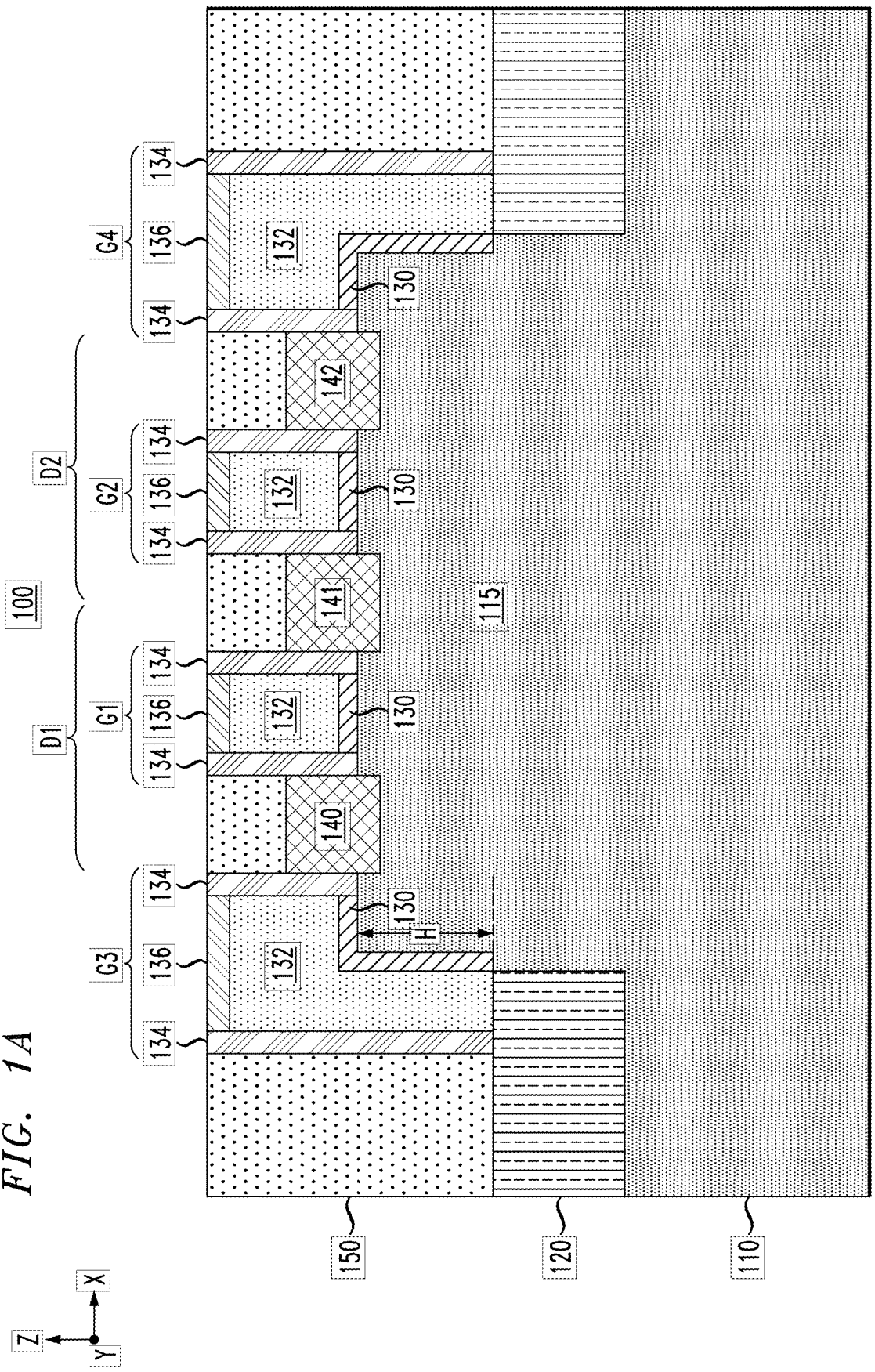
FIG. 1A is a cross-sectional side view of a semiconductor device at an intermediate stage of fabrication in which FinFET devices with respective dummy gate structures are formed on a semiconductor substrate.

Embodiments of the invention will now be discussed in further detail with methods for fabricating FinFET devices having uniform fin height profiles. As explained in further detail below, a uniform fin height profile for FinFET devices is obtained by implementing a gate oxide removal process which is configured to prevent etching of an isolation layer (e.g., STI layer) during removal of, e.g., sacrificial gate oxide layers of dummy gate structures. It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

To provide spatial context, XYZ Cartesian coordinates are shown in the drawings of semiconductor structures. It is to be understood that the term "vertical" as used herein denotes a Z-direction of the Cartesian coordinates shown in the drawings, and that the terms "horizontal" or "lateral" as used herein denotes an X-direction and/or Y-direction of the Cartesian coordinates shown in the drawings, which is perpendicular to the Z-direction.

FIGS. 1A through 9B schematically illustrate a process for fabricating FinFET devices having uniform fin height profiles, according to an embodiment of the invention. To begin, FIGS. 1A, 1B, 1C, and 1D are schematic views of a semiconductor device 100 at an intermediate stage of fabrication in which FinFET devices D1 and D2 with respective dummy gate structures G1 and G2 are formed on a semiconductor substrate. FIG. 1D is a schematic top plan view (X-Y plane) of the semiconductor device 100, while FIGS. 1A, 1B, and 1C are cross-sectional side views of the semiconductor device 100 along planes that are represented by respective lines shown in FIG. 1D. In particular, FIG. 1A is a cross-sectional side view (X-Z plane) of the semiconductor device 100 along line 1A-1A in FIG. 1D. FIG. 1B is a cross-sectional side view (Y-Z plane) of the semiconductor device 100 along line 1B-1B in FIG. 1D, and FIG. 1C is a cross-sectional side view (Y-Z plane) of the semiconductor device 100 along line 1C-1C in FIG. 1D.

As shown in FIGS. 1A, 1B, 1C, and 1D, the semiconductor device 100 comprises a semiconductor substrate 110, a plurality of vertical semiconductor fins 115, an isolation layer 120, gate structures G1, G2, G3, and G4, source/drain (S/D) layers 140, 141, and 142, and an inter-level dielectric (ILD) layer 150 (or pre-metal deposition (PMD) layer). In this stage of fabrication, the gate structures G1, G2, G3, and G4 comprise dummy gate structures, wherein each gate structure G1, G2, G3, and G4 comprises a sacrificial gate oxide layer 130 (e.g., dummy gate oxide), and a sacrificial gate electrode layer 132 (e.g., dummy gate polysilicon layer), which are formed over respective portions (e.g., channel regions) of the vertical semiconductor fins 115. The gate structures G1, G2, G3, and G4 are encapsulated in dielectric material (e.g., silicon nitride (SiN), silicon boron carbon nitride (SiBCN), etc.) in the form of gate sidewall spacers 134 and gate capping layers 136.

Figure 1B:
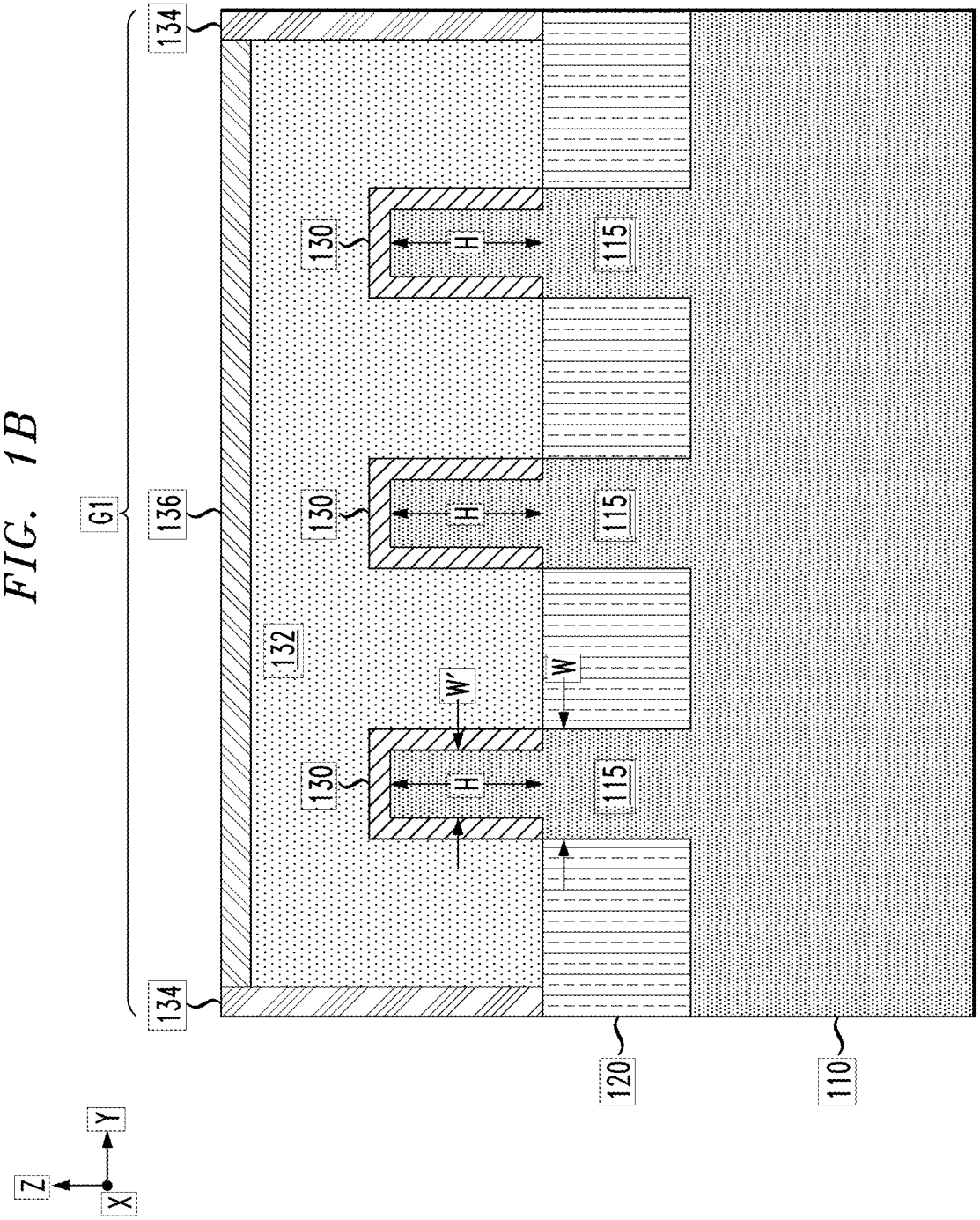
FIG. 1B is another cross-sectional side view of the semiconductor device at the intermediate stage of fabrication in which FinFET devices with respective dummy gate structures are formed on the semiconductor substrate.
Figure 1C:
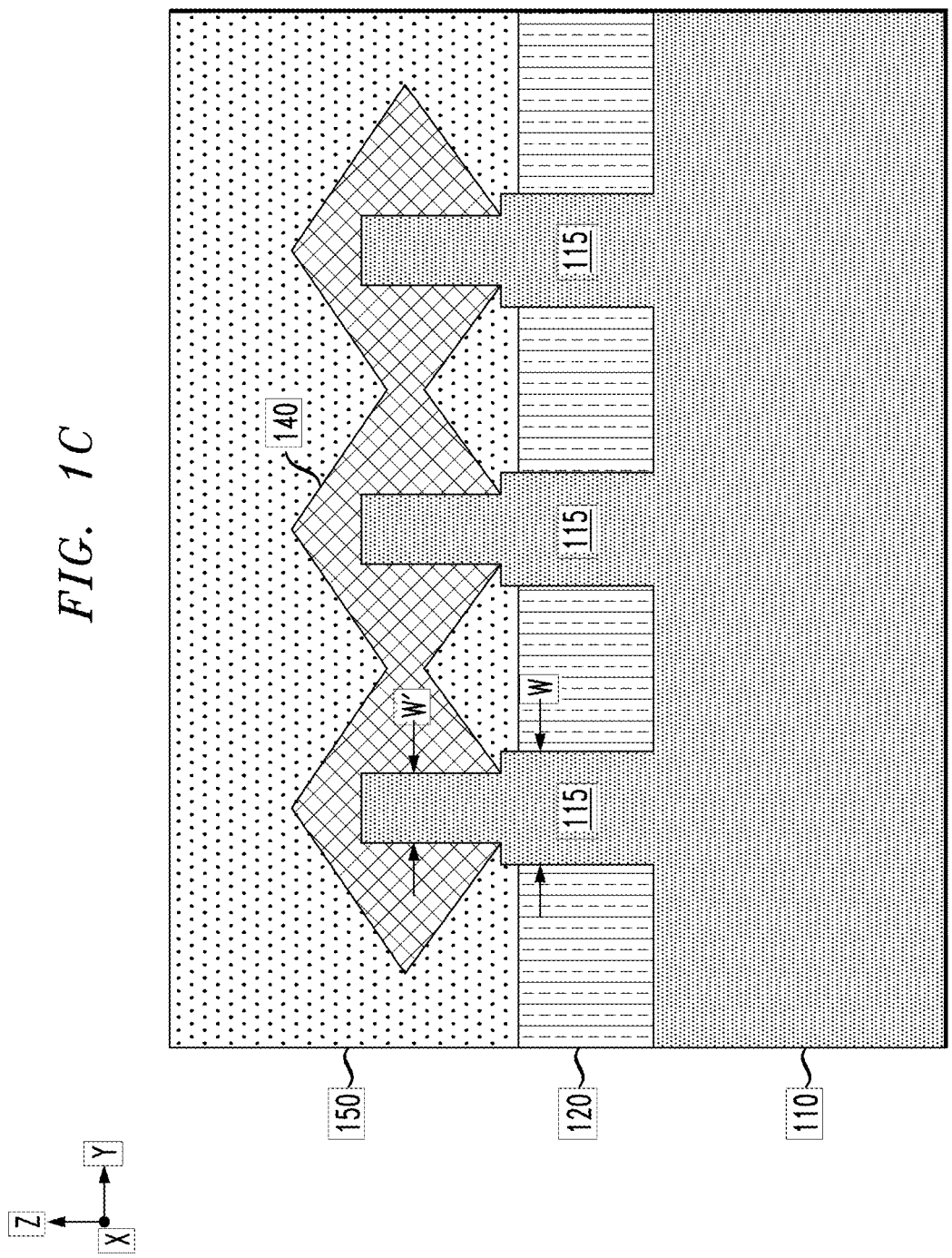
FIG. 1C is another cross-sectional side view of the semiconductor device at the intermediate stage of fabrication in which FinFET devices with respective dummy gate structures are formed on the semiconductor substrate.
Figure 1D:
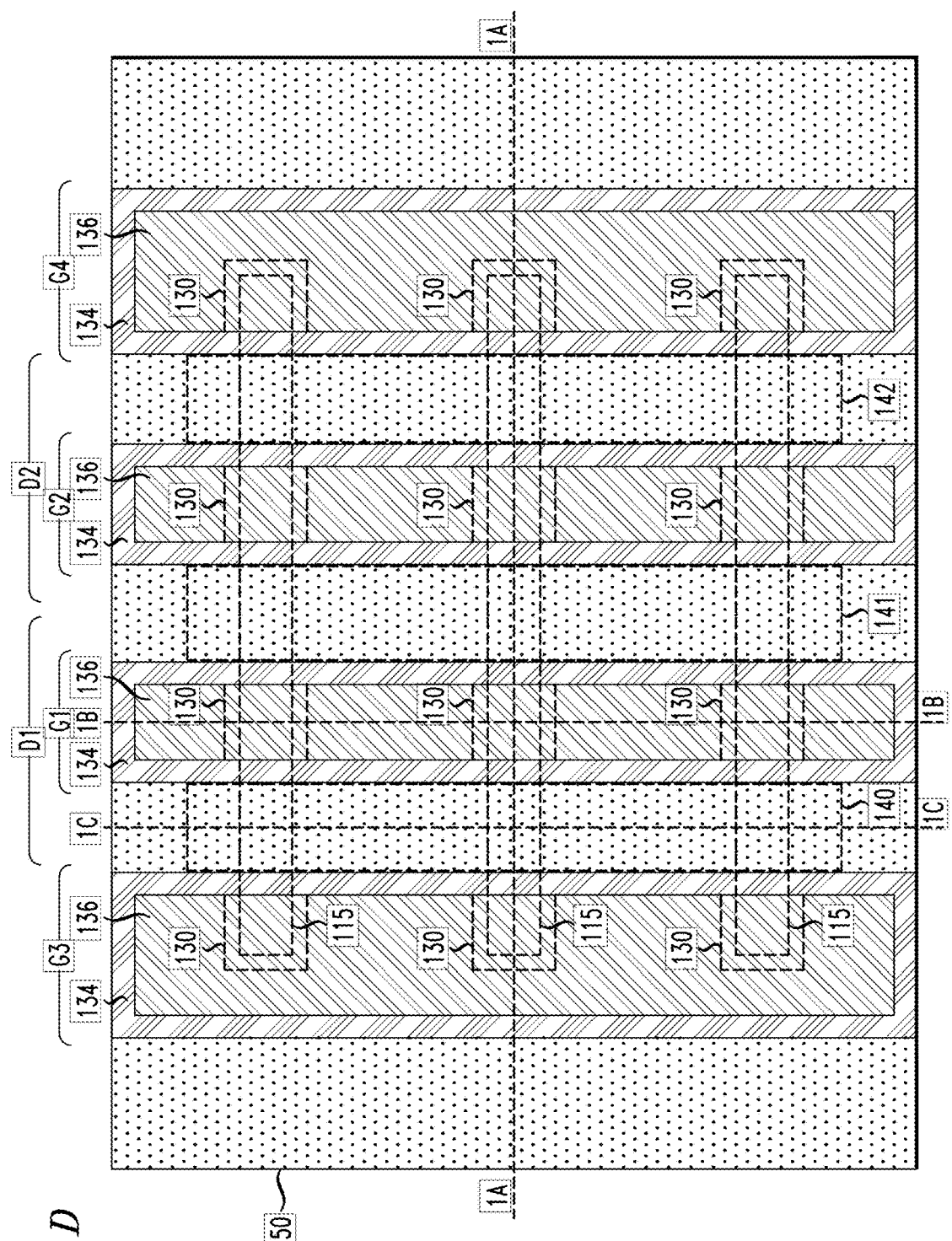

As shown in FIGS. 1A, 1C, and 1D, for example, the S/D layers 140, 141, and 142 are formed on exposed portions of the vertical semiconductor fins 115 which extend above the isolation layer 120 and which extend from the sides of the gate structures G1, G2, G3, and G4. As specifically shown in FIGS. 1C and 1D, for example, the S/D layers 140, 141, and 142 comprise faceted epitaxial layers that are grown on the exposed portions of the vertical semiconductor fins 115, wherein the faceted epitaxial layers are overgrown to form merged S/D structures.

In the illustrative embodiment, the FinFET device D1 comprises the gate structure G1 and the S/D layers 140 and 141 formed on opposing sides of the gate structure G1. Similarly, the FinFET device D2 comprises the gate structure G2 and the S/D layers 141 and 142 formed on opposing sides of the gate structure G2. Each gate structure G1 and G2 is formed over a portion of three vertical semiconductor fins 115. In this regard, each FinFET device D1 and D2 is configured as a multi-fin FinFET structure comprising, for example, three FinFET segments connected in parallel to form a multi-fin FinFET device. Further, in the example embodiment shown in FIG. 1D, the S/D layer 141 between the gate structures G1 and G2 serves as a common S/D layer that is shared by the FinFET devices D1 and D2, such that the FinFET devices D1 and D2 are connected in series.

As further shown in the illustrative embodiment of FIG. 1A-1D, the gate structures G3 and G4 are formed to encapsulate the end portions of the vertical semiconductor fins 115. In this embodiment, the gate structures G3 and G4 are not functional gate structures for FinFET devices. Instead, the gate structures G3 and G4 serve as dummy elements that isolate the end portions of the vertical semiconductor fins 115 and limit the extent of the growth of epitaxial material on the end portions of the vertical semiconductor fins 115 so as to achieve symmetry in the structural profile of the S/D layers 140, 141, and 142. Indeed, without the presence of the dummy gate elements G3 and G4, the size and structure of the S/D layers 140 and 142 would differ from that of the common S/D layer 141.

The semiconductor device 100 shown in FIGS. 1A-1D can be fabricated using known semiconductor fabrication techniques and semiconductor materials. For example, the semiconductor substrate 110 is illustrated as a generic substrate layer, and may comprise various structures and layers of semiconductor material. In one embodiment, the semiconductor substrate 110 comprises a bulk semiconductor substrate (e.g., wafer) formed of, e.g., silicon (Si), or other types of semiconductor substrate materials that are commonly used in bulk semiconductor fabrication processes such as germanium (Ge), a silicon-germanium (SiGe) alloy, silicon carbide (SiC), silicon-germanium carbide alloy, or compound semiconductor materials (e.g. III-V or II-VI, etc.). Non-limiting examples of III-V compound semiconductor materials include gallium arsenide, indium arsenide, and indium phosphide. In another embodiment, the semiconductor substrate 110 comprises a silicon-on-insulator (SOI) substrate, or a semiconductor-on-insulator (SemOI) substrate, which comprises an insulating layer (e.g., oxide layer) disposed between a base substrate layer (e.g., silicon substrate) and an active semiconductor layer (e.g., active Si or SiGe layer) in which active circuit components are formed as part of a FEOL (front end of line) structure.

The vertical semiconductor fins 115 and the isolation layer 120 can be fabricated using various methods. For example, for bulk and SOI/SemOI substrate embodiments, the vertical semiconductor fins 115 can be formed by patterning an active silicon layer (e.g., crystalline silicon, crystalline SiGe, III-V compound semiconductor material, etc.) at the surface of a bulk semiconductor substrate or the SOI/SemOI substrate to form a pattern of vertical semiconductor fins 115 in different device regions across the semiconductor wafer, three of which are shown in FIGS. 1A-1D for ease of illustration. In one embodiment, the vertical semiconductor fins 115 may be patterned from a crystalline SiGe layer that is epitaxially grown on top of a bulk silicon substrate or a bulk germanium substrate. A crystalline SiGe layer that is formed using an epitaxial growth process may comprise a relaxed SiGe layer or a strained SiGe layer. As is known in the art, strain engineering is utilized to enhance the carrier mobility for MOS transistors, wherein different types of Si—SiGe heterostructures can be fabricated to obtain and/or optimize different properties for CMOS FET devices. For example, silicon can be epitaxially grown on a SiGe substrate layer to form a strained Si layer. Moreover, a strained SiGe layer can be epitaxially grown on a silicon substrate layer. A strained-Si/relaxed-SiGe structure provides a tensile strain which primarily improves electron mobility for n-type FET devices, while a strained-SiGe/relaxed-Si structure provides a compressive strain which primarily improves hole mobility for p-type FET devices.

After forming the vertical semiconductor fins 115, the isolation layer 120 can be formed using known techniques. For example, a layer of insulating material (e.g., silicon oxide) is deposited to cover the vertical semiconductor fins 115, and then planarized (via chemical-mechanical planarization (CMP)) down to the top of the vertical semiconductor fins 115, and then further recessed (to a target level below the upper surface of the vertical semiconductor fins 115) using an etch-back process (e.g., selective Reactive Ion Etch (RIE) process) to form the isolation layer 120. As shown in FIGS. 1A and 1B, the isolation layer 120 is etched down to a target level to expose upper portions of the vertical semiconductor fin structures 115, which defines a baseline active fin height H for the FinFET devices D1 and D2. In one embodiment of the invention, the oxide material of the isolation layer 120 can be selectively etched using RIE, although other etching processes may be employed. A timed etch can be performed to remove a desired amount of the insulating material to recess the isolation layer 120 down to a target thickness as needed to achieve the desired active fin height H of the vertical semiconductor fins 115.

Next, the gate structures G1, G2, G3 and G4 are fabricated using known process flows to form dummy gates. For example, in one embodiment, a conformal oxide layer (which forms the sacrificial oxide layers 130) is formed to cover the exposed portions of the vertical semiconductor fins 115. The conformal oxide layer can be formed by thermally growing an oxide layer (e.g., silicon oxide) on the exposed surfaces of semiconductor fins 115 (e.g., Si or SiGe fin surfaces, etc.) using known techniques, or by depositing a conformal layer of oxide material (e.g., silicon dioxide) over the surface of the semiconductor substrate using known techniques such as atomic layer deposition (ALD), chemical vapor deposition (CVD), etc.

In another embodiment, as shown in FIGS. 1B and 1C, the conformal oxide layer can be formed by oxidizing the exposed surfaces of the vertical semiconductor fins 115 (above the isolation layer 120) to a target depth to form the thin sacrificial oxide layer 130. In one embodiment, the oxidation process is performed using a low-temperature plasma-assisted oxidation process, with an oxygen plasma stream generated using known techniques and other precursors (inert gases) such as nitrogen or argon. This process results in selectively oxidizing the surface of the active portions of the vertical semiconductor fins 115 which extends above a surface of the isolation layer 120 to form the sacrificial gate oxide layers 130. The oxidation process can be adjusted to oxidize different surfaces of the vertical semiconductor fins 115 at different rates. For example, when the sidewall surfaces of the vertical semiconductor fins 115 have a (110) crystal orientation, the oxidation process is performed at double ($2\lambda$) the rate as compared to oxidation of (100) or (111) crystal surfaces.

In this embodiment, subsequent removal of the sacrificial oxide layers 130 results in the thinning of the width profiles of the upper (active) portions of the vertical semiconductor fins 115 which extend above the isolation layer 120. In particular, as shown in FIG. 1B, while the vertical semiconductor fins 115 are initially formed with an initial thickness W, the oxidation process is performed to oxidize the exposed surfaces of the semiconductor fins 115 to a target depth (e.g., about 1 nm to 5 nm) within the exposed surfaces of the vertical semiconductor fins 115. In this regard, subsequent removal of the sacrificial oxide layers 130 results in removal of material thickness from the surfaces of the semiconductor fins 115, resulting in the formation of active portions of the vertical semiconductor fins 115 with thinner width profiles W', where W'<W.

In another embodiment, the sacrificial oxide layer can be formed of multiple layers. For example, the sacrificial oxide layer can have a first layer that is formed by selectively oxidizing the semiconductor material of the exposed surfaces of the vertical semiconductor fins 115, and a second oxide layer that is selectively grown or deposited on the oxidized surfaces of the vertical semiconductor fins 115. In other embodiments, when FinFET devices in certain device regions of the wafer are to be utilized as input/output (I/O) transistors which require a relatively large current flow, the sacrificial gate oxide layers of the dummy gate structures of the FinFET devices are formed with relatively thick gate dielectric layers (e.g., silicon oxide). During a subsequent metal gate replacement process, the gate dielectric layers are maintained (i.e., not removed) in the device regions having FinFET devices which are utilized as I/O transistors devices, while the gate dielectric layers are removed in the device regions having FinFET devices which require think, high-k gate dielectric layers. The thick gate oxide layers for I/O FinFET devices are designed to withstand time-dependent dielectric breakdown (TDDB) and other gate failure mechanisms that may result from high power applications.

Following formation of the sacrificial gate oxide layers 130, a layer of sacrificial silicon material (e.g., polysilicon or amorphous silicon), is then blanket deposited over the semiconductor substrate and then planarized. The layer of sacrificial silicon material forms the dummy gate electrode layers 132 shown in FIGS. 1A and 1B. The layer of sacrificial silicon material can be deposited using known methods such as CVD, physical vapor deposition (PVD), electro-chemical deposition, and other suitable deposition methods. The layer of sacrificial silicon material can be planarized using CMP.

The sacrificial layer of silicon is then patterned to form the sacrificial gate electrode layers 132 of the dummy gate structures. The patterning can be performed by depositing a layer of hard mask material (e.g., SiN) and patterning the layer of hard mask material to form a hard mask with an image that defines an image of the dummy gate structures. The patterning of the hard mask layer can be performed using, for example, a multi-patterning process such as a Sidewall Image Transfer (SIT) process, as is known in the art. The hard mask is then used in an anisotropic etch process to etch away exposed portions of the sacrificial layer of silicon down to the isolation layer 120 to form the sacrificial gate electrode layers 132. In addition, an oxide etch process is then performed to selectively remove the portions of the sacrificial oxide layers on the surfaces of the vertical semiconductor fins 115 outside of the gate regions, which allows epitaxial source/drain material to be grown on the surface areas of the vertical semiconductor fins 115 outside of the gate regions (as shown in FIG. 1C, for example). In the example embodiment of FIGS. 1A-1D, the gate capping layers 136 represent portions of the hard mask which remain at the completion of the dummy gate patterning process.

As shown in FIG. 1C, removing the sacrificial oxide layers 130 from the surfaces of the vertical semiconductor fins 115 outside of the gate regions G1, G2, G3, and G4 results in a slight recessing of the exposed portion of the isolation layer 120 outside of the gate regions. The recessing of the isolation layer 120 outside the gate regions results in the exposure of an upper region of the wider (W) portions of the vertical semiconductor fins 115. However, since the recessed portions of the isolation layer 120 are outside of the gate regions G1, G2, G3, and G4, the recessing of the isolation layer 120 outside of the gate regions G1, G2, G3, and G4 would not cause the performance issues of the FinFET devices (e.g., device leakage) as discussed herein as would arise as a result of recessing of the isolation layer 120 within the gate regions.

The gate sidewall spacers 134 are then formed by conformally depositing and patterning a layer of dielectric material (or multiple layers) such as SiN, SiBCN, or other low-k dielectric materials which are suitable for use as gate insulating spacers for gate structures of FinFET devices. The one or more layers of dielectric material can be deposited using plasma-enhanced chemical vapor deposition (PECVD), atomic layer deposition (ALD), or other suitable deposition methods which enable the deposition of thin films of dielectric material with high conformality. The conformal layer of dielectric material is anisotropically etched using a directional RIE process remove portions of the conformal layer of dielectric material from lateral surfaces, while leaving portions of the conformal layer of dielectric material on vertical surfaces, to thereby form the gate sidewall spacers 134 which surround sacrificial gate electrode layers 132.

After forming the gate sidewall spacers 134, the process flow continues with forming the S/D layers 140, 141, and 142 on the exposed portions of the vertical semiconductor fins 115 extending from the sidewalls of the gate structures G1, G2, G3, and G4. In one embodiment of the invention, the S/D layers 140, 141, and 142 are formed by growing epitaxial semiconductor material on the exposed surfaces of the S/D layers of the vertical semiconductor fins 115 adjacent to the gate structures G1, G2, G3, and G4. The type of epitaxial material and doping that is used to form the S/D layers 140, 141, and 142 will vary depending on whether the FinFET devices D1 and D2 are P-type or N-type devices. As shown in FIGS. 1C and 1D, the source/drain layers are epitaxially grown on the exposed portions of the vertical semiconductor fins 115 so that the source/drain layers which are formed on adjacent vertical semiconductor fins 115 eventually merge to collectively form the S/D layers 140, 141, and 142. The S/D layers 140, 141, and 142 are formed by epitaxially growing crystalline semiconductor material on (and slightly within) the exposed surfaces of the semiconductor fins 115 using known techniques, such as CVD (chemical vapor deposition), MOCVD (metal-organic chemical vapor deposition), LPCVD (low pressure chemical vapor deposition), MBE (molecular beam epitaxy), VPE (vapor-phase epitaxy), MOMBE (metal organic molecular beam epitaxy), or other known epitaxial growth techniques.

Following formation of the S/D layers 140, 141, and 142, the process flow continues with depositing and planarizing a layer of dielectric material to form the ILD layer 150. The ILD layer 150 is formed, for example, by depositing one or more layers of insulating material over the surface of the semiconductor substrate to cover the dummy gate structures, and then planarizing the surface of the semiconductor substrate down to a level which exposes the upper surface of the gate capping layers 136 of the gate structures G1, G2, G3, and G4. The ILD layer 150 can be formed using suitable dielectric materials including, but not limited to, silicon oxide, hydrogenated silicon carbon oxide (SiCOH), SiCH, SiCNH, or other types of silicon based low-k dielectrics (e.g., k less than about 4.0), porous dielectrics, or known ULK (ultra-low-k) dielectric materials (with k less than about 2.5). For example, the ILD layer 150 may comprise a single deposited layer of insulating material, or multiple layers of insulating material (e.g., a first layer of a flowable oxide and a second layer of insulating material formed on the first layer). The ILD layer 150 may be deposited using known deposition techniques, such as, for example, ALD, PECVD, PVD (physical vapor deposition), or spin-on deposition.

Following formation of the ILD layer 150, the process flow continues with a replacement metal gate (RMG) process module to remove the dummy gate structures (i.e., remove the sacrificial gate electrode layers 132 and sacrificial gate oxide layers 130), and form metallic gate structures in place of the dummy gate structures. As explained in further detail below, a uniform fin height profile for FinFET devices D1 and D2 is obtained by implementing a gate oxide removal process module which is configured to prevent etching of the isolation layer 120 within the gate regions during removal of the sacrificial gate oxide layers 130.

Figure 2A:
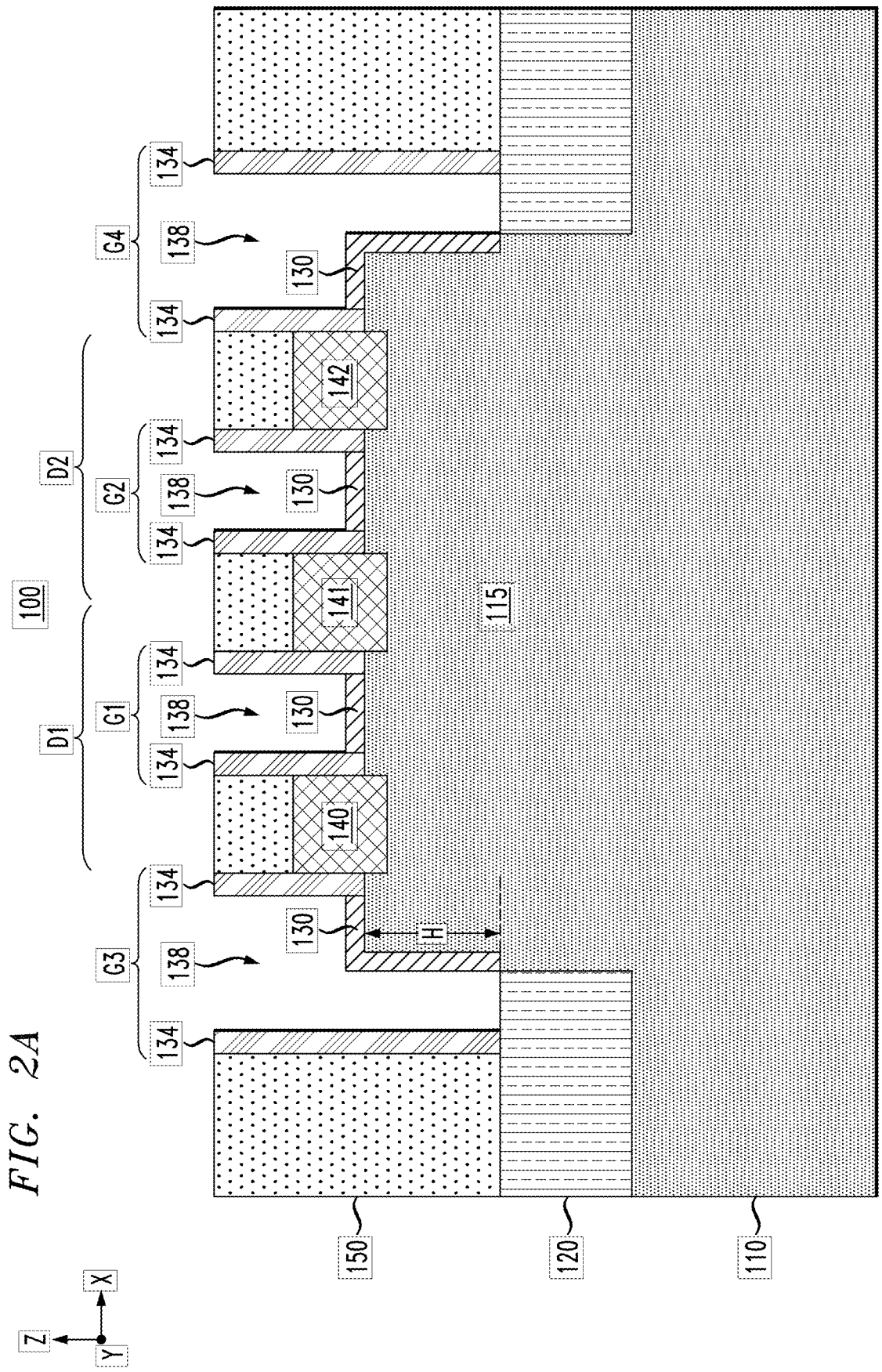
FIG. 2A is a cross-sectional side view of the semiconductor device of FIG. 1A after removing gate capping layers and sacrificial gate electrode layers of the dummy gate structures to form gate openings that expose sacrificial gate oxide layers of the dummy gate structures and portions of an isolation layer within the gate openings.
Figure 2B:
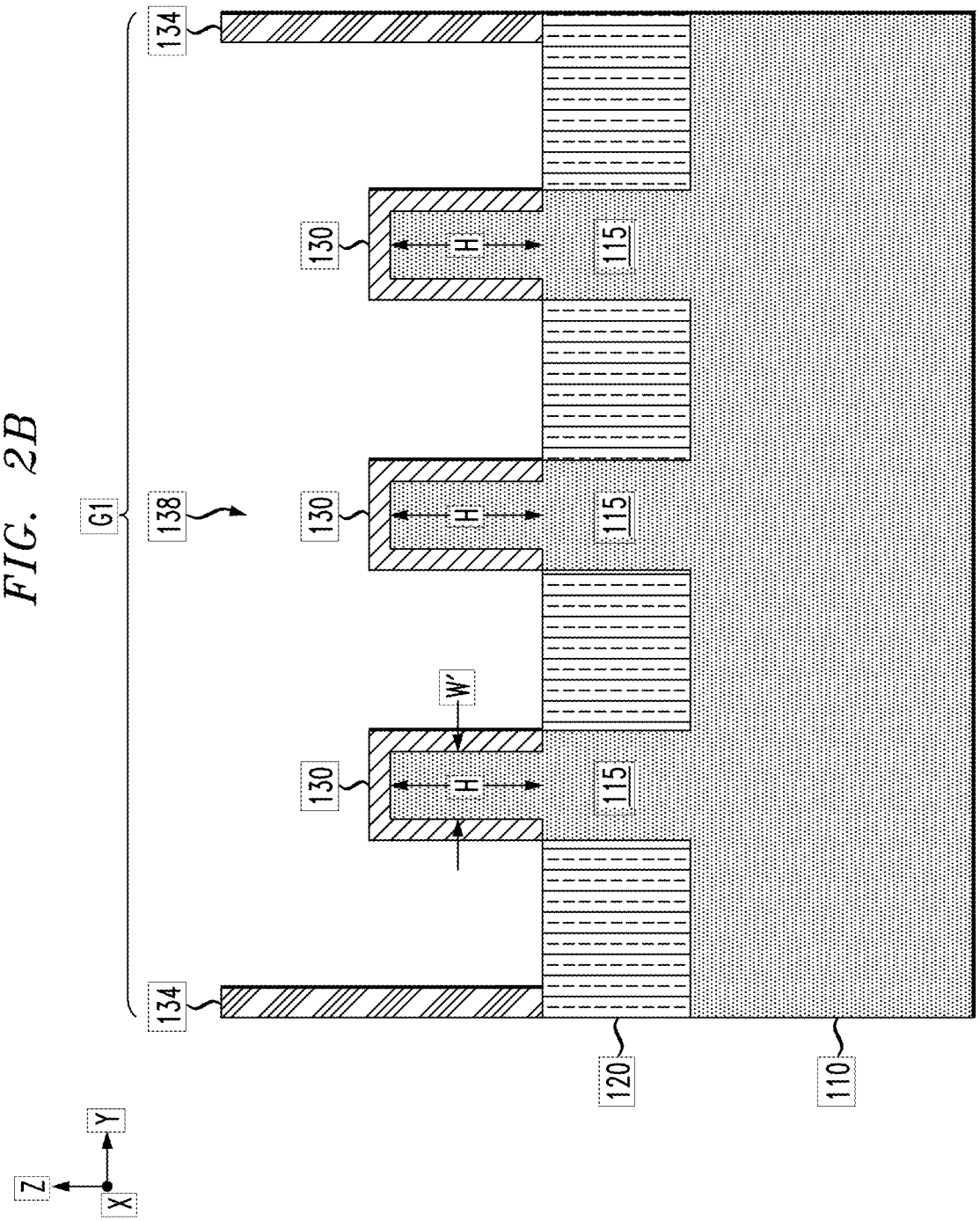
FIG. 2B is a cross-sectional side view of the semiconductor device of FIG. 1B after removing the gate capping layers and the sacrificial gate electrode layers of the dummy gate structures to form the gate openings that expose the sacrificial gate oxide layers of the dummy gate structures and portions of the isolation layer within the gate openings.
Figure 2C:
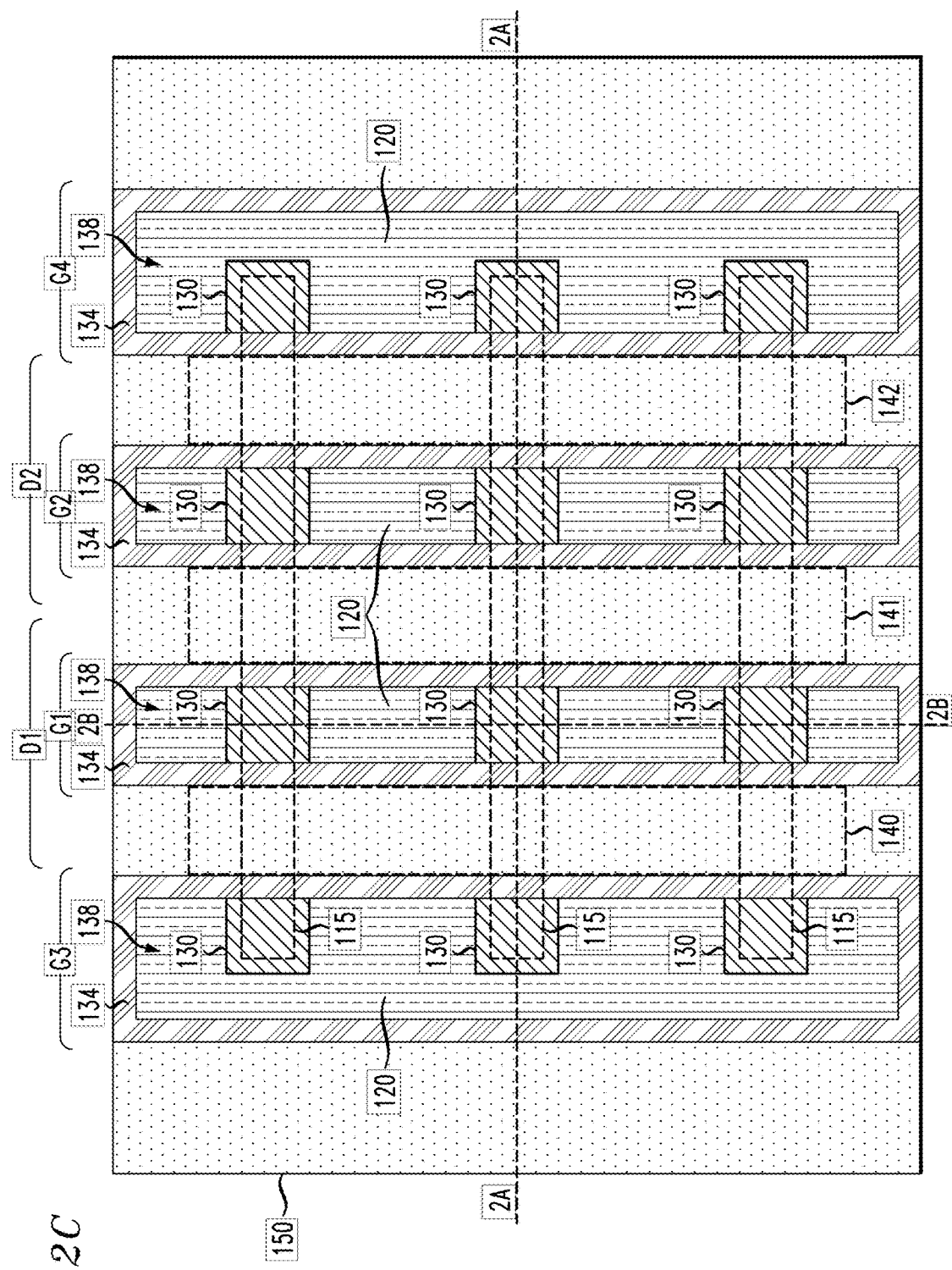
FIG. 2C is a top plan view of the semiconductor device of FIG. 1D after removing the gate capping layers and the sacrificial gate electrode layers of the dummy gate structures to form the gate openings that expose the sacrificial gate oxide layers of the dummy gate structures and portions of the isolation layer within the gate openings.

To begin, FIGS. 2A, 2B, and 2C are schematic views of the semiconductor device of FIGS. 1A, 1B, and 1D, respectively, after removing the gate capping layers 136 and the sacrificial gate electrode layers 132 of the dummy gate structures to form gate openings 138 which expose the sacrificial gate oxide layers 130 of the dummy gate structures and portions of the isolation layer 120 within the gate openings 138. FIG. 2C is a schematic top plan view (X-Y plane) of the semiconductor device 100, FIG. 2A is a cross-sectional side view (X-Z plane) of the semiconductor device 100 along line 2A-2A in FIG. 2C, and FIG. 2B is a cross-sectional side view (Y-Z plane) of the semiconductor device 100 along line 2B-2B in FIG. 2C.

The gate capping layers 136 are removed using known techniques. For example, in one embodiment, a chemical-mechanical polish (CMP) process can be used to recess the surface of the semiconductor device 100 down to an upper surface of the sacrificial gate electrode layers 132 of the dummy gate structures. With the CMP process, the ILD layer 150 and the gate sidewall spacers 134 are also recessed. In another embodiment, the gate capping layers 136 can be removed by forming an etch mask on the surface of the semiconductor device, wherein the etch mask comprises openings to expose the gate capping layers 136, and performing a RIE process having an etch chemistry configured to anisotropically etch away the gate capping layers 136 and expose the underlying sacrificial gate electrode layers 132.

The sacrificial gate electrode layers 132 are then removed using a wet etch process (e.g., TetraMethyl Ammonium Hydroxide (TMAH) chemical etch solution), or a dry etch process (e.g., $NF_3+H_2$ gas phase chemical etch), which is configured to etch away the sacrificial silicon material of the dummy gate electrode layers 132 selective to the dielectric and insulating materials of the gate sidewall spacers 134, the underlying sacrificial gate oxide layers 130, and the portions of the isolation layer 120 exposed within the gate openings 138. The dummy gate electrode etch process is performed to expose the underlying sacrificial gate oxide layers 130 of the dummy gate structures, resulting in the semiconductor structures shown in FIGS. 2A, 2B and 2C. As shown in FIG. 2C, the gate openings 138 comprise opened areas surrounded by (and defined by) the gate sidewall spacers 134 of the gate structures G1, G2, G3, and G4.

Figure 3A:
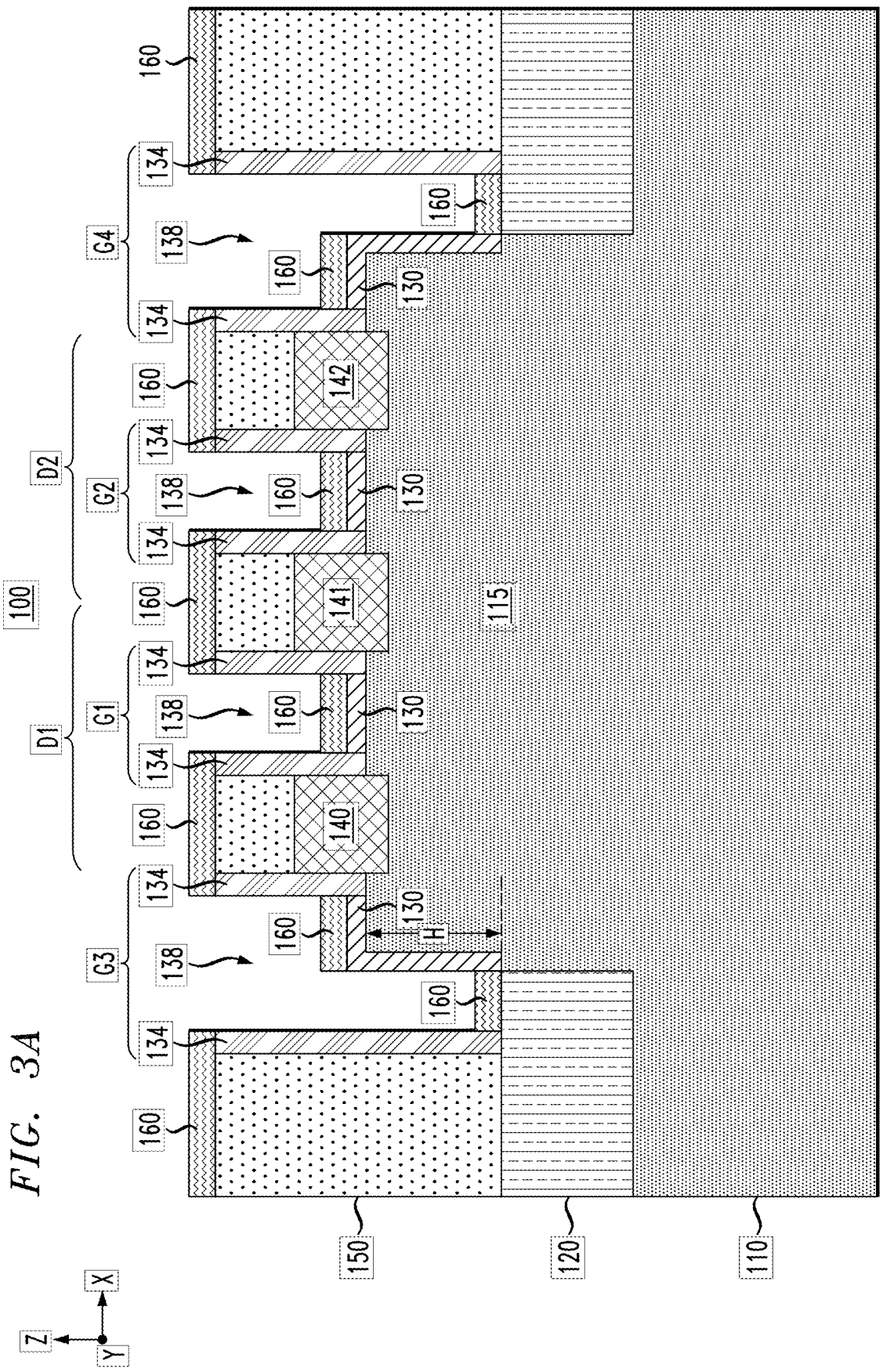
FIG. 3A is a cross-sectional side view of the semiconductor device of FIG. 2A after selectively forming a first etch protection layer on exposed lateral surfaces of the semiconductor device including exposed surfaces of the isolation layer within the gate openings.

A next stage of the fabrication process comprises removing the sacrificial gate oxide layers 130, which are exposed within the gate openings 138, using a process module which prevents etching portions of the isolation layer 120 exposed at the bottom of the gate openings 138 (at the bottom of the opened gate structures G1, G2, G3, and G4). As an initial step, FIGS. 3A and 3B are schematic views of the semiconductor device of FIGS. 2A and 2B, respectively, after selectively forming a first etch protection layer 160 on exposed lateral surfaces of the semiconductor device including the surfaces of the portions of the isolation layer 120 exposed within the gate openings 138. In one embodiment, the first etch protection layer 160 is formed by anisotropically depositing a layer of material using a deposition method in which the material of the first etch protection layer 160 is only deposited on horizontal (lateral) surfaces of the semiconductor surface topography.

The first etch protection layer 160 is formed with any suitable material that can be etched selective to the oxide and nitride materials of, e.g., the isolation layer 120, the sacrificial gate oxide layers 130, and the gate sidewall spacers 134. For example, in one embodiment, the first etch protection layer 160 comprises a layer of silicon carbide (SiC) which is deposited using a high-density plasma (HDP) CVD process with bias, using known techniques. An SiC etch protection layer 160 can be formed by an HDP-CVD process that uses a gaseous mixture which includes a hydrocarbon-containing gas such as methane and a silicon-containing gas such as silane. The HDP deposition chemistry can be configured to obtain precise thickness control and a highly anisotropic deposition profile using known techniques. In other embodiments, the first etch protection layer 160 can be formed of materials such as SiN, silicon oxycarbonitride (SiOCN), silicon carbon oxide (SiCO), amorphous-Si, etc., which provides the etch selectivity as noted above, and which can be deposited with precise thickness and anisotropic deposition profile control.

The first etch protection layer 160 is utilized to protect the exposed portions of the isolation layer 120 within the gate openings 138 from being etched during a subsequent process in which the sacrificial gate oxide layers 130 are removed. In this regard, those portions of the first etch protection layer 160 which are disposed on the ILD layer 150 and on the upper surfaces of the sacrificial gate oxide layers 130 above the vertical semiconductor fins 115 will be removed prior to the gate oxide etch process, while leaving those portions of the first etch protection layer 160 which are disposed on the surfaces of the isolation layer 120 within the gate openings 138. The removal of target portions of the first etch protection layer 160 is achieved by forming a second etch protection layer to cover those portions of the first etch protection layer 160 that are disposed on the surfaces of the isolation layer 120 within the gate openings 138, followed by a selective etch process to remove those portions of the first etch protection layer 160 which are not covered by the second etch protection layer, as schematically illustrated in FIGS. 4A, 4B, 5A, and 5B.

Figure 4A:
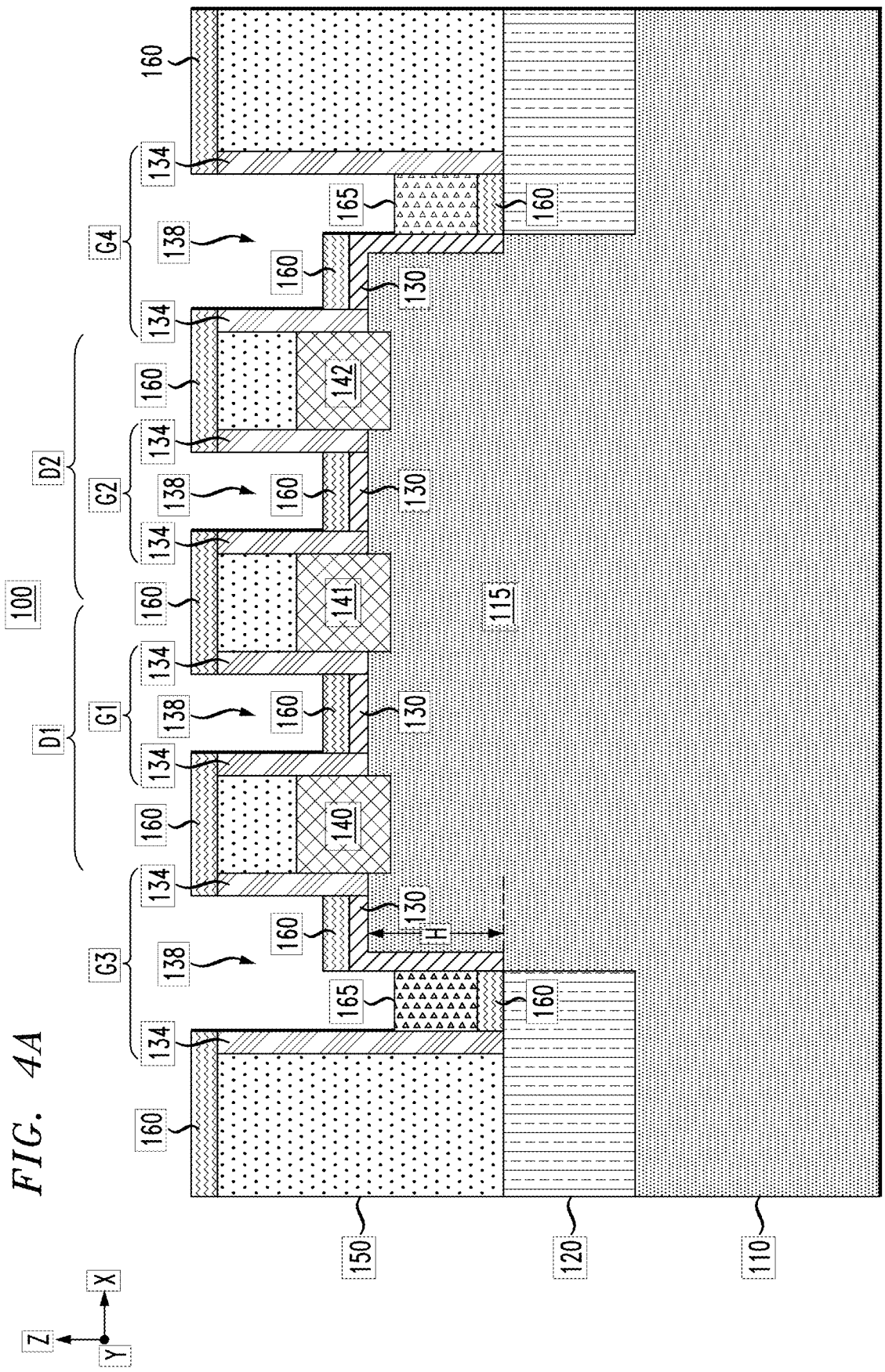
FIG. 4A is a cross-sectional side view of the semiconductor device of FIG. 3A after depositing and patterning a sacrificial dielectric layer to form a second etch protection layer which covers portions of the first etch protection layer that are disposed on the surfaces of the isolation layer.
Figure 4B:
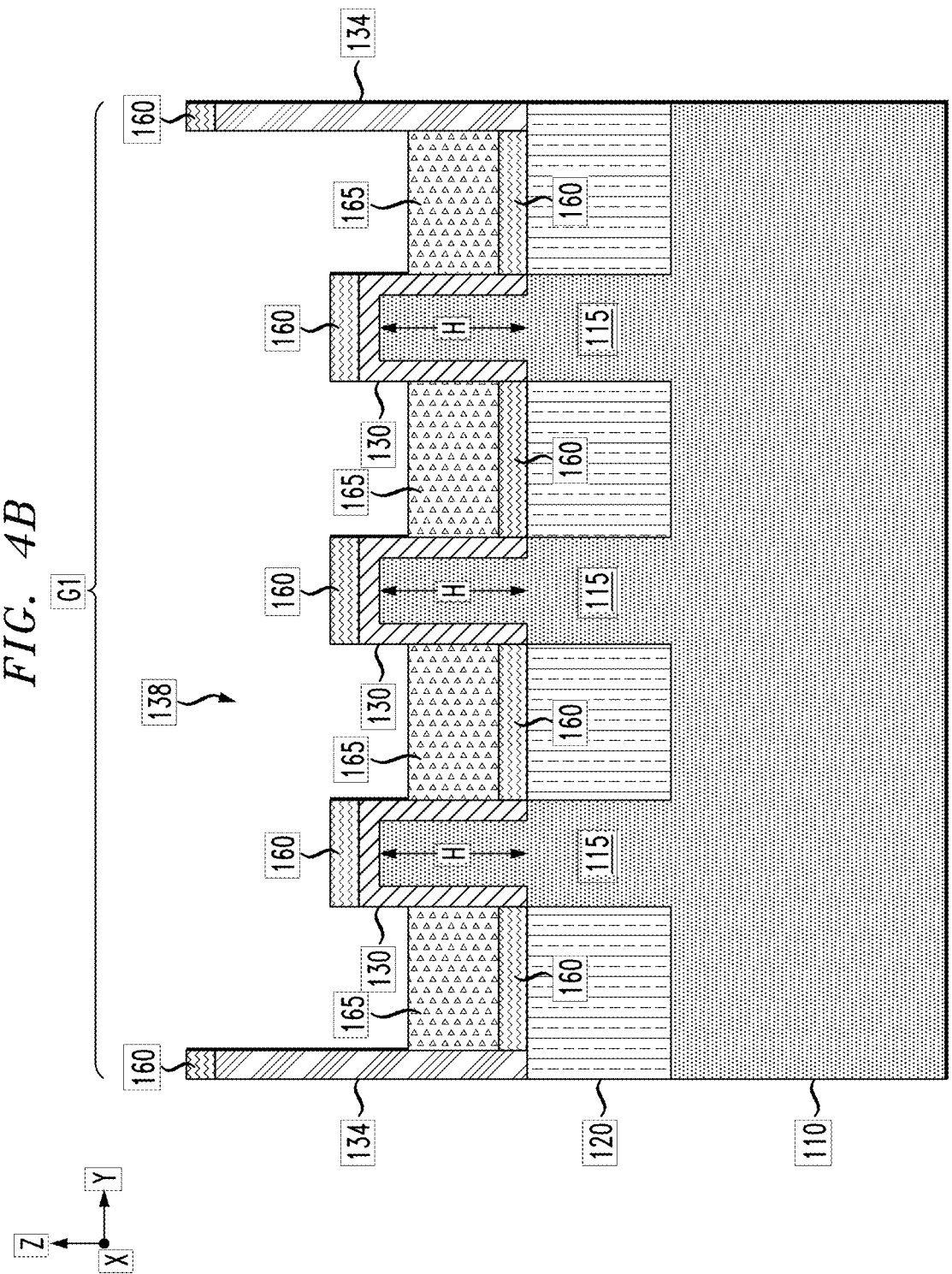
FIG. 4B is a cross-sectional side view of the semiconductor device of FIG. 3B after depositing and patterning the sacrificial dielectric layer to form the second etch protection layer which covers portions of the first etch protection layer that are disposed on the surfaces of the isolation layer.

In particular, FIGS. 4A and 4B are schematic views of the semiconductor device of FIGS. 3A and 3B, respectively, after depositing and patterning a sacrificial dielectric layer to form a second etch protection layer 165 which covers portions of the first etch protection layer 160 that are disposed on the surfaces of the isolation layer 120 within the gate openings 138. In one embodiment, the second etch protection layer 165 is formed by depositing a self-planarizing layer of dielectric material (e.g., organic planarizing layer (OPL)), followed by an etch-back process to recess the self-planarizing layer of dielectric material to a target level below the upper surfaces of the vertical semiconductor fins 115. The second etch protection layer 165 can be formed of any suitable self-planarizing dielectric material that can be deposited by spin coating and then either baked to enhance planarization or hardened photochemically.

In another embodiment, when the sacrificial gate oxide layers are to be utilized as gate dielectric layers for high-power I/O FinFET devices in certain device regions across the wafer, those sacrificial gate oxide layers are protected from etching during the dummy gate removal process. In this embodiment, following deposition of the self-planarizing layer of dielectric material (e.g., OPL), an anti-reflection coating (ARC) layer (e.g., Si-ARC) and a photoresist layer can be sequentially formed on the self-planarizing layer of dielectric material prior to performing the etch-back process. A photoresist etch mask is then formed by photolithographically patterning the photoresist layer (using a suitable exposure and developing process), wherein the photoresist mask comprises openings which expose FinFET device regions where the sacrificial oxide layers will be removed, and wherein the photoresist mask covers FinFET device regions where the sacrificial gate oxide layers are to be used as gate dielectric layers for metal gates of the FinFET devices. In this manner, only those portions of the self-planarizing layer of dielectric material which are exposed by the photoresist mask are etched-back, as discussed above.

The process of forming the second etch protection layer 165 has a relatively large process window with regard to the precision in the etch-back process. In particular, the etch-back process only needs to be performed so that the thickness of the second etch protection layer 165 is recessed to any level that is at or below the upper surface of the vertical semiconductor fins 115. As such, there is flexibility and large margin in the etch-back process to form the second etch protection layer 165. As shown in FIGS. 4A and 4B, following the etch-back process, the portions of the first etch protection layer 160 on the ILD layer 150 and the lateral surfaces of the sacrificial gate oxide layer 130 are exposed, while the portions of the first etch protection layer 160 disposed on the isolation layer 120 are covered by the second etch protection mask 165.

Figure 5A:
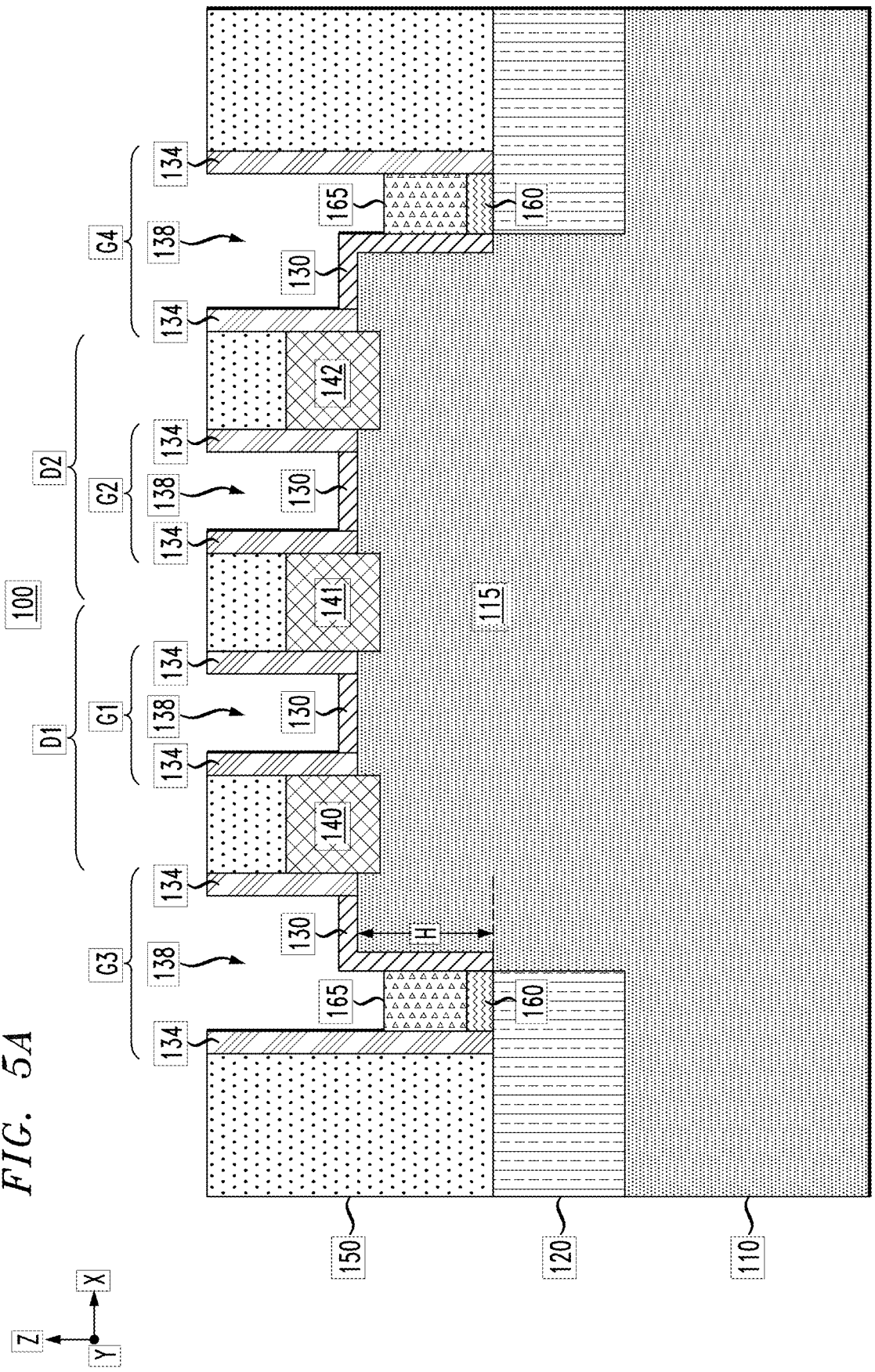
FIG. 5A is a cross-sectional side view of the semiconductor device of FIG. 4A after performing an etch process to selectively remove portions of the first etch protection layer which are not covered by the second etch protection layer.
Figure 5B:
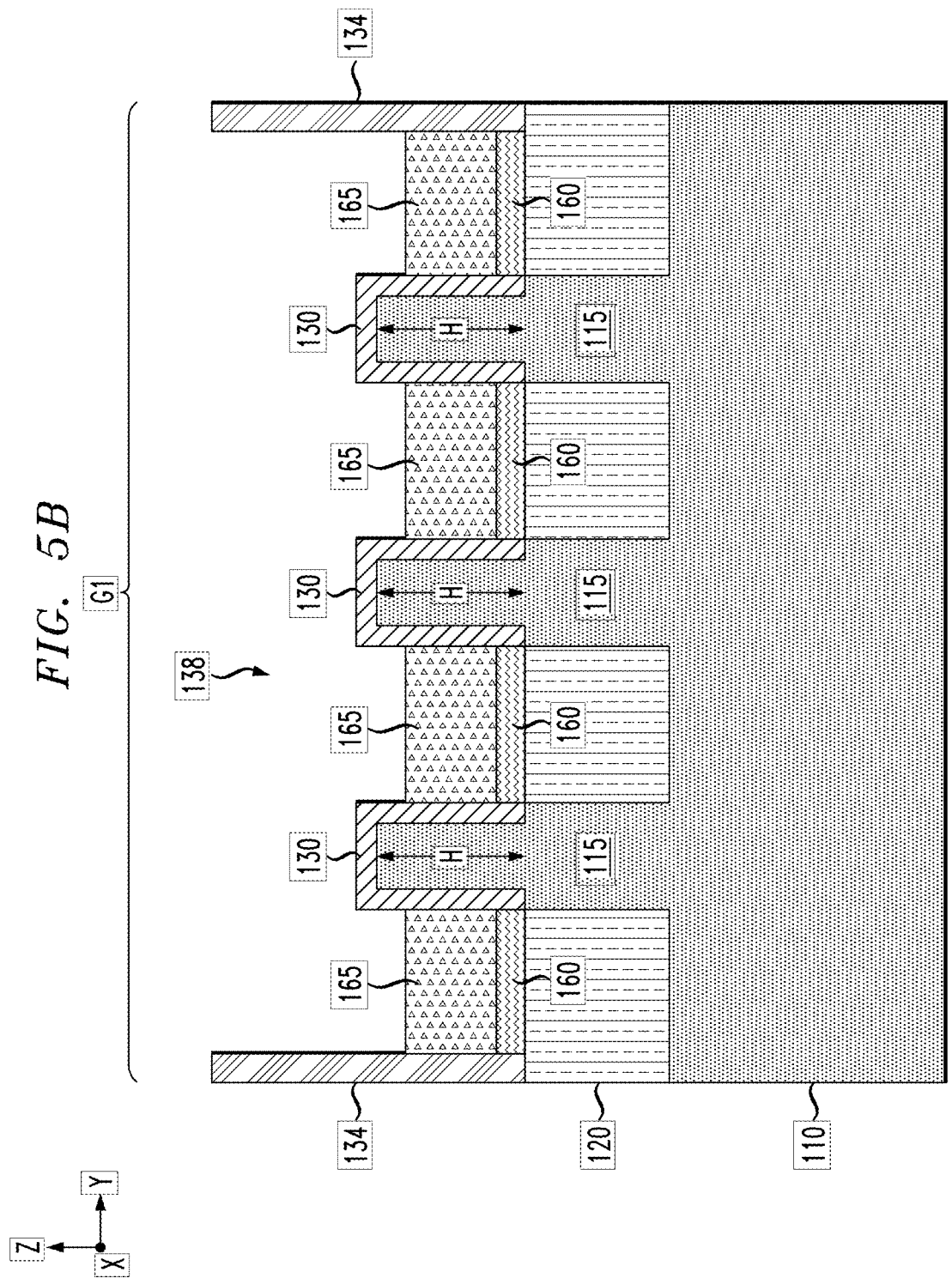
FIG. 5B is a cross-sectional side view of the semiconductor device of FIG. 4B after performing the etch process to selectively remove portions of the first etch protection layer which are not covered by the second etch protection layer.

FIGS. 5A and 5B are schematic views of the semiconductor device of FIGS. 4A and 4B, respectively, after performing an etch process to selectively remove portions of the first etch protection layer 160 which are not covered by the second etch protection layer 165. The etch process can be performed using a wet etch process or a dry etch process, which has an etch chemistry and etch environment that allows the material (e.g., SiC) of the first etch protection layer 160 be etched highly selective to the materials of the ILD layer 150, the gate sidewall spacers 134, the sacrificial gate oxide layers 130, and the second etch protection layer 165. For example, when the first etch protection layer 160 is formed of SiC material, the first etch protection layer 160 can be dry etched (via RIE) highly selective (e.g., 100:1) to the oxide and nitride materials of the ILD layer 150, the gate sidewall spacers 134, and the sacrificial gate oxide layers 130 using, for example, an etching gas which includes a hydrogen-containing fluorocarbon gas such as $CH_3F$, an oxygen-containing gas such as $O_2$ and an optional carrier gas such as Ar.

Following removal of the selected portions of the first etch protection layer 160, the process flow continues with stripping away the second etch protection layer 165, removing the sacrificial gate oxide layers 130, and then removing remaining portions of the first etch protection layer 160. For example, FIGS. 6A and 6B are schematic views of the semiconductor device of FIGS. 5A and 5B, respectively, after performing an etch process to selectively remove the second etch protection layer 165. The second etch protection layer 165 can be etched using any suitable wet etch or dry etch technique, wherein the etch chemistry and etch environment is configured to etch the material of the second etch protection layer 165 selective to the materials of the surrounding features/elements.

Figure 7A:
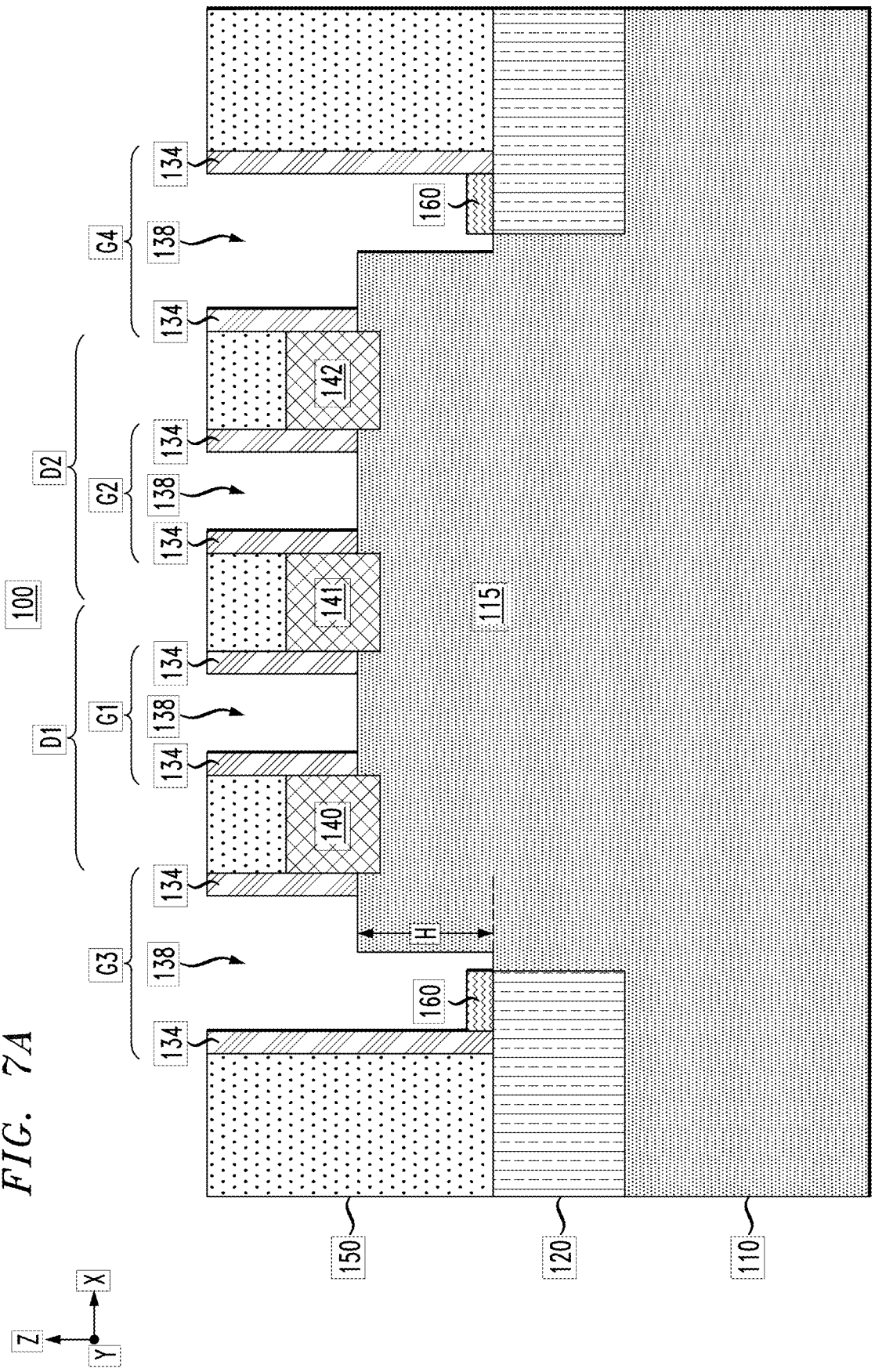
FIG. 7A is a cross-sectional side view of the semiconductor device of FIG. 6A after performing an etch process to selectively remove the sacrificial gate oxide layers of the dummy gate structures.
Figure 7B:
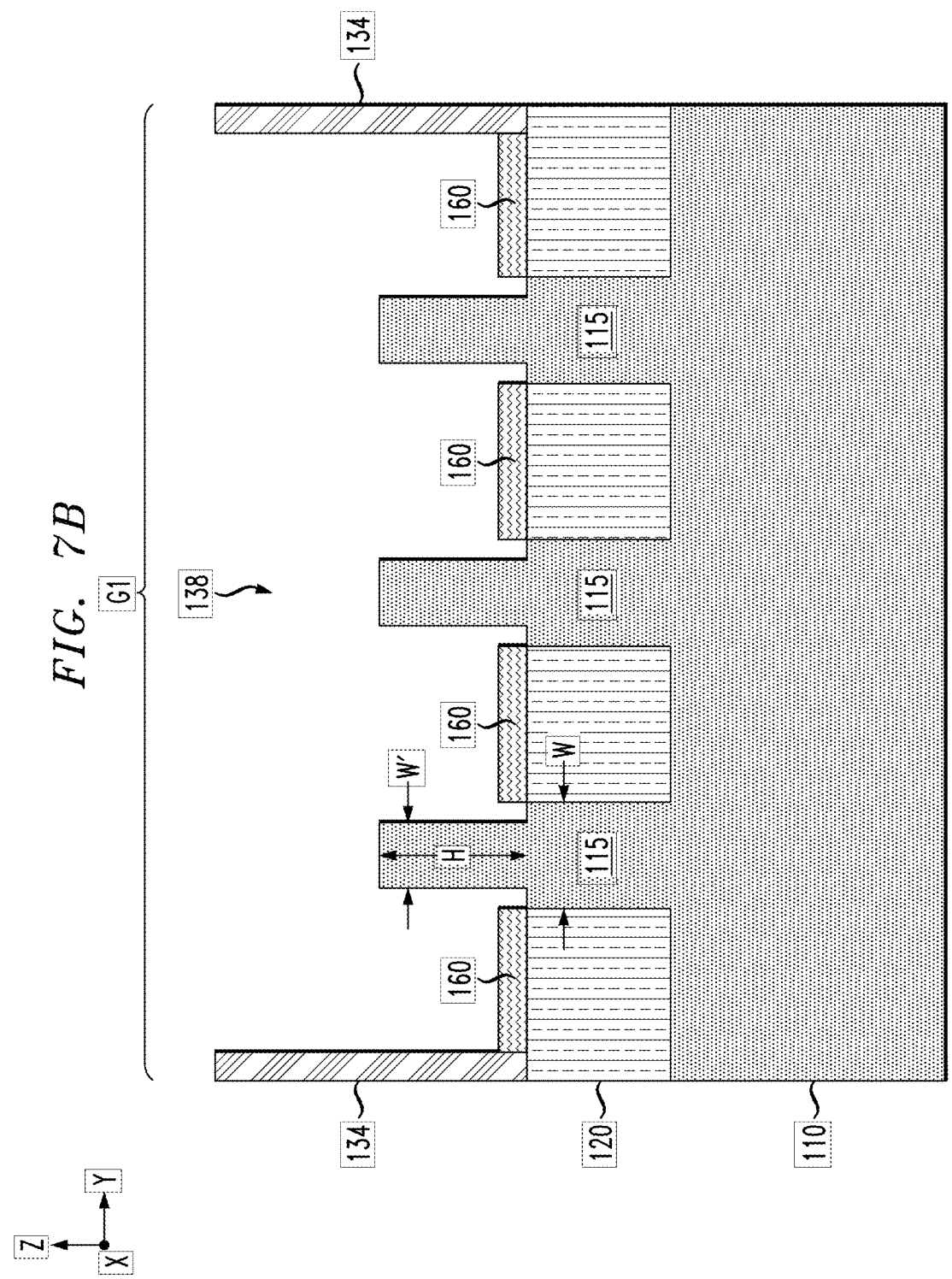
FIG. 7B is a cross-sectional side view of the semiconductor device of FIG. 6B after performing the etch process to selectively remove the sacrificial gate oxide layers of the dummy gate structures.

Next, FIGS. 7A and 7B are schematic views of the semiconductor device of FIGS. 6A and 6B, respectively, after performing an etch process to selectively remove the sacrificial gate oxide layers 130 of the dummy gate structures. During the gate oxide etch process, the underlying portions of the isolation layer 120 within the gate openings 128 are protected by the first etch protection layer 160, which prevents recessing and loss of the thickness of the isolation layer 120. As further shown in FIGS. 7A and 7B, the removal of the sacrificial gate oxide layer 130 results in the formation of thinned upper portions of the semiconductor fins 115 (active fin portions) above the isolation layer 120 within the gate regions, wherein the active fin height H has width W' which is less than the initial width W of the bottom portions of the semiconductor fins 115 which are covered by the isolation layer 120.

In one embodiment, the sacrificial gate oxide layers 130 are removed using an isotropic etch process which has an etch chemistry that is configured to etch the material of the sacrificial gate oxide layers 130 highly selective to the material of the first etch protection layer 160. For example, when the first etch protection layer 160 is formed of SiC, an etch selectivity of 100:1 (oxide:SiC) can be achieved using an HF-based wet etch chemistry. Since the thickness of the first protection layer 160 (e.g., thickness of an SiC layer) can be precisely controlled, and since the selectivity of the oxide etch can be precisely controlled, no variation in the oxide removal process of FIGS. 7A and 7B is introduced and, thus, the underlying isolation layer 120 can be readily protected from being etched during removal of the sacrificial gate oxide layers 130.

Next, FIGS. 8A and 8B are schematic views of the semiconductor device of FIGS. 7A and 7B, respectively, after performing an etch process to selectively remove remaining portions of the first etch protection layer 160. In one embodiment, the remaining portions of the first etch protection layer 160 are removed using a wet etch process or dry etch process having an etch chemistry which is highly selective to the materials of the first etch protection layer 160 so as to prevent/minimize etching of the materials of, e.g., the isolation layer 120, the semiconductor fins 115, and the gate sidewall spacers 134. For example, in one embodiment where the first etch protection layer 160 is formed of SiC, a dry etch process can be performed to etch the first (SiC) etch protection layer 160 highly selective to silicon oxide and silicon nitride materials using an etch gas comprising a hydrogen-containing fluorocarbon gas such as $CH_3F$, an oxygen-containing gas such as $O_2$ and an optional carrier gas such as Ar.

As shown in FIGS. 8A and 8B, following removal of the remaining portions of the first etch protection layer 160, the portions of the isolation layer 120 within the gate openings 138 are not recessed below the active fin height H of the upper portions (active and thinned portions) of the semiconductor fins 115 (active and thinned portions). In particular, as schematically illustrated in FIGS. 8A and 8B, an upper surface of the isolation layer 120 is a substantially level with a transition region between the upper (thinner) active portion (width of W') of the vertical semiconductor fin 115 and the lower (wider) inactive portion (width of W) of the vertical semiconductor fin 115. As such, the isolation layer 120 is not recessed, and remains to fully cover the bottom portions (inactive and wider portions) of the semiconductor fins 115, thus achieving a uniform CD (critical dimension) in the vertical (height) direction of the semiconductor fins 115. This is to be contrasted with conventional methods where the first etch protection layer 160 is not utilized, which results in the isolation layer 120 within the gate openings 138 being recessed during etching and removal of the sacrificial gate oxide layers 130, which results in a non-uniform CD of the vertical semiconductor fins 115 in the vertical height direction within the gate regions.

Figure 9:
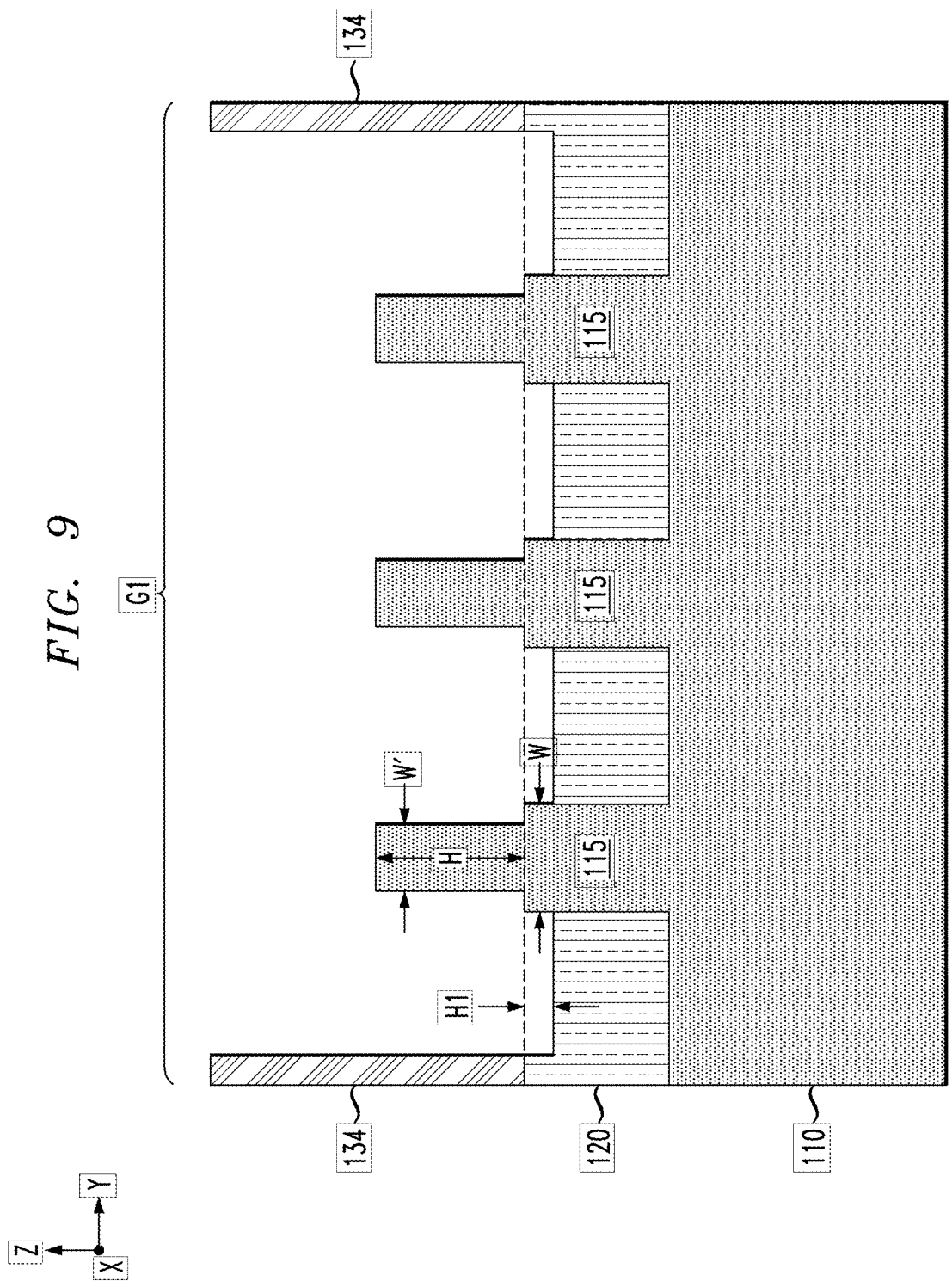
FIG. 9 is a cross-sectional side view of the semiconductor device of FIG. 2B after removing the sacrificial gate oxide layers of the dummy gate structures in a conventional process in which the first etch protection layer is not utilized to protect the isolation layer during etching of the sacrificial gate oxide layers.

By way of example, FIG. 9 is schematic view of the semiconductor device of FIG. 2B after removing the sacrificial gate oxide layers 130 of the dummy gate structures in a conventional process in which the first etch protection layer 160 is not utilized to protect the isolation layer 120 during etching of the sacrificial gate oxide layers 130. As shown in FIG. 9, removal of the sacrificial gate oxide layers 130 would result in etching of the exposed surface of the isolation layer 120 within the opened gate region 138, thereby resulting in the recessing of the exposed upper surface of the isolation layer 120 by an amount H1. The recessing of the isolation layer 120 results in the exposure of an upper region of the wider (W) portions of the vertical semiconductor fins 115 by the amount H1. In this process, the active fin height (H+H1) of the vertical semiconductor fins 115 within the gate regions is increased, wherein each vertical semiconductor fin 115 has a non-uniform vertical (height) profile comprising a thinned upper portion (W') of height H, and a wider lower portion (W) of height H1. As noted above, this non-uniformity in the active height profile of the vertical semiconductor fins 115 can decrease devices performance due to, e.g., undesired leakage paths in the FinFET gate structures.

Following removal of the remaining portions of the first etch protection layer 160, metallic gate structures of the FinFET devices D1 and D2 are formed using known techniques. For example, the metallic gate structures can be formed to include gate dielectric layers and metallic gate electrode layers. The metallic gate structures are formed by depositing one or more conformal layers of gate dielectric material over the surface of the semiconductor structure, depositing one or more layers of conductive material over the gate dielectric material, and performing a planarization process (e.g., CMP) to polish the surface of the semiconductor structure down to the ILD layer 150. The CMP process serves to remove the overburden portions of the gate dielectric and conductive materials and, thus, form the gate dielectric layers and the metallic gate electrode layers of the gate structures G1, G2, G3 and G4. As noted above, the resulting metallic gate structures for gates G1 and G2 are functional gate structures of the FinFET devices D1 and D2, respectively, while the resulting metallic gate structures for gate G3 and G4 are non-functional gate structures which are formed for reasons discussed above.

The gate dielectric layers are formed with any suitable dielectric material including, for example, nitride, oxynitride, or oxide or a high-k dielectric material having a dielectric constant of about 3.9 or greater. In particular, the gate dielectric material can include silicon oxide, silicon nitride, silicon oxynitride, boron nitride, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k gate dielectric material may further include dopants such as lanthanum, aluminum. In one embodiment of the invention, the conformal layer of gate dielectric material is formed with a thickness in a range of about 0.5 nm to about 2.5 nm, which will vary depending on the target application. The gate dielectric material of the gate dielectric layers is deposited using known methods such as ALD, which allows for high conformality of the gate dielectric material.

The gate electrode layers are formed with any suitable conductive material including, for example, doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of such conductive materials. The layer of conductive material may further comprise dopants that are incorporated during or after deposition. The layer of conductive material is deposited using a suitable deposition process, for example, CVD, PECVD, PVD, plating, thermal or e-beam evaporation, sputtering, etc.

In another embodiment, a thin conformal layer of work function metal (WFM) may be deposited over the conformal gate dielectric layer prior to forming the gate electrode layer. The thin conformal WFM layer can be formed of one or more types of metallic materials, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or other work function metals or alloys that are commonly used to obtain target work functions which are suitable for the type (e.g., n-type or p-type) of vertical FET devices that are to be formed. The conformal WFM layer is deposited using known methods such as ALD, CVD, etc. In one embodiment, the conformal WFM layer is formed with a thickness in a range of about 2 nm to about 5 nm. In another embodiment, the conductive material that forms the gate electrode layers can serve as a WFM layer.

The type of gate structures that are formed will depend on the type of FinFET devices D1 and D2. For example, when the FinFET devices D1 and D2 are utilized in logic circuitry requiring high-performance (e.g., high gate control), and low-power consumption, the FinFET devices D1 and D2 are fabricated with thin, high-k gate dielectric layers. On the other hand, as noted above, when the FinFET devices in certain device regions are utilized as I/O transistors which require a relatively large current flow, the gate structures comprise relatively thick gate dielectric layers (e.g., silicon oxide) which can withstand time-dependent dielectric breakdown and other gate failure mechanisms that may result from high power applications.

Following the formation of the metal gate structures, a middle-of-the-line (MOL) process module is performed using known materials and fabrication techniques to form MOL contacts, such as vertical gate, source, and drain contacts, and other device contacts to active and/or passive components formed as part of a FEOL layer, the details of which are not necessary for one of ordinary skill in the art to understand embodiments of the invention as discussed herein. In addition, following the MOL process module, a BEOL (back end of line) process module is performed using known materials and fabrication techniques to form a BEOL interconnect structure to provide connections between the FinFET devices and other active or passive devices that are formed as part of the FEOL layer, the details of which are not necessary for one of ordinary skill in the art to understand embodiments of the invention as discussed herein.

It is to be understood that the methods discussed herein for fabricating FinFET devices with uniform height profiles of vertical semiconductor fins can be incorporated as part of various semiconductor processing flows for fabricating other types of semiconductor devices and integrated circuits with various analog and digital circuitry or mixed-signal circuitry. The integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A method for fabricating a semiconductor device, comprising:
    forming a vertical semiconductor fin on a semiconductor substrate;
    forming an isolation layer on the semiconductor substrate, wherein the isolation layer covers a bottom portion of the vertical semiconductor fin, and wherein an active portion of the vertical semiconductor fin extends above a surface of the isolation layer;
    forming a dummy gate structure to overlap a portion of the active portion of the vertical semiconductor fin, wherein the dummy gate structure comprises a sacrificial gate oxide layer, a sacrificial gate electrode layer formed on the sacrificial gate oxide layer, and a gate sidewall spacer surrounding sidewalls of the sacrificial gate electrode layer;
    removing the dummy gate structure by etching the sacrificial gate electrode layer, etching the sacrificial gate oxide layer, and utilizing a first etch protection layer to prevent recessing of the isolation layer during the etching of the sacrificial gate oxide layer; and
    forming a metallic gate structure in place of the dummy gate structure;
    wherein removing the dummy gate structure comprises:
        etching the sacrificial gate electrode layer selective to the gate sidewall spacer and the sacrificial gate oxide layer, to form a gate opening defined by the gate sidewall spacer, wherein the gate opening exposes the sacrificial gate oxide layer and a portion of the isolation layer at a bottom of the gate opening;
        forming the first etch protection layer on the portion of the isolation layer exposed within the gate opening;

etching the sacrificial gate oxide layer exposed within the gate opening using an etch process which etches the sacrificial gate oxide layer selective to the first etch protection layer; and removing the first etch protection layer using an etch process which etches the first etch protection layer selective to the isolation layer.

2. The method of claim 1, wherein the first etch protection layer comprises silicon carbide material and wherein the isolation layer comprises silicon oxide material.

3. The method of claim 1, wherein forming the first etch protection layer on the portion of the isolation layer exposed within the gate opening, comprises:

performing an anisotropic deposition process to selectively deposit a first layer of insulating material on exposed lateral surfaces, wherein a portion of the first layer of insulating material forms the first etch protection layer which covers the portion of the isolation layer exposed within the gate opening;

forming a second etch protection layer to cover the first etch protection layer;

performing an etch process to selectively remove portions of the first layer of insulating material which are not covered by the second etch protection layer; and performing an etch process to remove the second etch protection layer selective to the first etch protection layer.

4. The method of claim 3, wherein performing the anisotropic deposition process comprises anisotropically depositing a layer of silicon carbide material on the exposed lateral surfaces to form the first etch protection layer.

5. The method of claim 3, wherein forming the second etch protection layer comprises:

forming a self-planarizing layer of insulating material to fill the gate opening with the dielectric material; and performing an etch-back process to recess the self-planarizing layer of insulating material down to a target level which is below an upper surface of the active portion of the vertical semiconductor fin.

6. The method of claim 1, wherein forming the dummy gate structure comprises selectively growing an oxide layer on a surface of the active portion of the vertical semiconductor fin which extends above a surface of the isolation layer, wherein sacrificial gate oxide layer comprises the selectively grown oxide layer.

7. The method of claim 1, wherein forming the dummy gate structure comprises selectively oxidizing a surface of the active portion of the vertical semiconductor fin which extends above a surface of the isolation layer, wherein the sacrificial gate oxide layer of the dummy gate structure comprises the oxidized surface of the active portion of the vertical semiconductor fin such that removing the sacrificial gate oxide layer results in thinning of the active portion of the vertical semiconductor fin.

8. The method of claim 1, wherein forming the vertical semiconductor fin comprises etching a surface of the semiconductor substrate to form the vertical semiconductor fin, and wherein forming the isolation layer comprises:

forming a planarized layer of oxide material over the etched surface of the semiconductor substrate to cover the vertical semiconductor fin; and performing an etch-back process to recess the planarized layer of oxide material down to a target thickness to form the isolation layer.

9. The method of claim 1, further comprising forming source/drain layers on exposed portions of the vertical semiconductor fin which extend past the gate sidewall spacer on opposing sides of the dummy gate structure.

10. A method for fabricating a semiconductor device, comprising:

forming a vertical semiconductor fin on a semiconductor substrate, the vertical semiconductor fin having a first width;

forming an isolation layer on the semiconductor substrate, wherein the isolation layer covers a bottom portion of the vertical semiconductor fin, and wherein an active portion of the vertical semiconductor fin extends above a surface of the isolation layer;

selectively oxidizing a surface of the active portion of the vertical semiconductor fin which extends above a surface of the isolation layer to form a sacrificial gate oxide layer;

forming a dummy gate structure to overlap a portion of the active portion of the vertical semiconductor fin, wherein the dummy gate structure comprises the sacrificial gate oxide layer, a sacrificial gate electrode layer formed on the sacrificial gate oxide layer, and a gate sidewall spacer surrounding sidewalls of the sacrificial gate electrode layer;

removing the dummy gate structure by etching the sacrificial gate electrode layer, etching the sacrificial gate oxide layer, and utilizing a first etch protection layer to prevent recessing of the isolation layer during the etching of the sacrificial gate oxide layer; and forming a metallic gate structure in place of the dummy gate structure;

wherein removing the dummy gate structure comprises:
etching the sacrificial gate electrode layer selective to the gate sidewall spacer and the sacrificial gate oxide layer, to form a gate opening defined by the gate sidewall spacer, wherein the gate opening exposes the sacrificial gate oxide layer and a portion of the isolation layer at a bottom of the gate opening;

forming the first etch protection layer on the portion of the isolation layer exposed within the gate opening;

etching the sacrificial gate oxide layer exposed within the gate opening using an etch process which etches the sacrificial gate oxide layer selective to the first etch protection layer, wherein removing the sacrificial gate oxide layer results in thinning of the active portion of the vertical semiconductor fin within the gate opening to a second width, which is less than the first width of a portion of the vertical semiconductor fin covered by the isolation layer; and removing the first etch protection layer using an etch process which etches the first etch protection layer selective to the isolation layer;

wherein the first etch protection layer protects the isolation layer from being recessed during etching of the sacrificial gate oxide layer so that the portion of the vertical semiconductor fin having the first width remains covered by the isolation layer.

11. The method of claim 10, wherein the first etch protection layer comprises silicon carbide material and wherein the isolation layer comprises silicon oxide material.

12. The method of claim 10, wherein forming the first etch protection layer on the portion of the isolation layer exposed within the gate opening, comprises:

performing an anisotropic deposition process to selectively deposit a first layer of insulating material on exposed lateral surfaces, wherein a portion of the first layer of insulating material forms the first etch protection layer which covers the portion of the isolation layer exposed within the gate opening;

forming a second etch protection layer to cover the first etch protection layer;

performing an etch process to selectively remove portions of the first layer of insulating material which are not covered by the second etch protection layer; and performing an etch process to remove the second etch protection layer selective to the first etch protection layer.

13. The method of claim 12, wherein performing the anisotropic deposition process comprises anisotropically depositing a layer of silicon carbide material on the exposed lateral surfaces to form the first etch protection layer.

14. The method of claim 12, wherein forming the second etch protection layer comprises:

forming a self-planarizing layer of insulating material to fill the gate opening with the dielectric material; and performing an etch-back process to recess the self-planarizing layer of insulating material down to a target level which is below an upper surface of the active portion of the vertical semiconductor fin.

15. The method of claim 10, wherein forming the vertical semiconductor fin comprises etching a surface of the semiconductor substrate to form the vertical semiconductor fin, and wherein forming the isolation layer comprises:

forming a planarized layer of oxide material over the etched surface of the semiconductor substrate to cover the vertical semiconductor fin; and performing an etch-back process to recess the planarized layer of oxide material down to a target thickness, which defines the active portion of the vertical semiconductor fin.

16. The method of claim 10, further comprising forming source/drain layers on exposed portions of the vertical semiconductor fin which extend past the gate sidewall spacer on opposing sides of the dummy gate structure.

* * * * *